United States Patent
Yoshida

(10) Patent No.: US 10,217,602 B2
(45) Date of Patent: Feb. 26, 2019

(54) CHARGED PARTICLE BEAM APPARATUS AND ABERRATION CORRECTOR

(71) Applicant: HITACHI HIGH-TECHNOLOGIES CORPORATION, Minato-ku, Tokyo (JP)

(72) Inventor: Takaho Yoshida, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/324,124

(22) PCT Filed: Jul. 3, 2015

(86) PCT No.: PCT/JP2015/069220
§ 371 (c)(1),
(2) Date: Jan. 5, 2017

(87) PCT Pub. No.: WO2016/006539
PCT Pub. Date: Jan. 14, 2016

(65) Prior Publication Data
US 2017/0162362 A1    Jun. 8, 2017

(30) Foreign Application Priority Data

Jul. 7, 2014   (JP) .................................. 2014-139297

(51) Int. Cl.
*H01J 37/153*   (2006.01)

(52) U.S. Cl.
CPC ..... *H01J 37/153* (2013.01); *H01J 2237/1534* (2013.01)

(58) Field of Classification Search
USPC ........................................................ 250/310
See application file for complete search history.

(56) References Cited

U.S. PATENT DOCUMENTS 5,371,371 A * 12/1994 Yamazaki ............. H01J 37/073
                                                     250/396 ML
6,723,997 B2 * 4/2004 Matsuya ............... G01N 23/225
                                                     250/305
(Continued)

FOREIGN PATENT DOCUMENTS

JP    2010-114068 A    5/2010

*Primary Examiner* — Phillip A Johnston
(74) *Attorney, Agent, or Firm* — Miles & Stockbridge P.C.

(57) ABSTRACT

High expectations are placed on aberration correctors to increase the resolving power of charged particle devices. Meanwhile, a far more complicated configuration and higher mechanical precision assembly in comparison to prior art aberration correctors are necessary in charged particle beam optical devices that use low-energy electron beams. A complex electromagnetic quadrupole part employed in the aberration corrector preferably has the forward extremities of the poles provided in a vacuum near an electron beam path and excitation coils disposed outside the vacuum, and this necessitates a structure that can achieve both electrical insulation and vacuum sealing for each of these poles. Such structural complexity generally conflicts with improving mechanical assembly precision. The complicated structure in the above problems can be simplified by: separating the electrodes and the magnetic poles in the complex electromagnetic multipole that had been used in prior art aberration correctors; and offsetting the positions of both, or ensuring that the widths of both do not match. Consequently, improvement of mechanical assembly precision can be achieved.

14 Claims, 12 Drawing Sheets

(56) References Cited

U.S. PATENT DOCUMENTS

| | | | |
|---|---|---|---|
| 8,592,776 B2 * | 11/2013 | Enyama | H01J 37/1472 250/306 |
| 8,729,491 B2 * | 5/2014 | Dohi | H01J 3/26 250/306 |
| 2010/0084567 A1 * | 4/2010 | Sawada | H01J 37/145 250/396 ML |

* cited by examiner

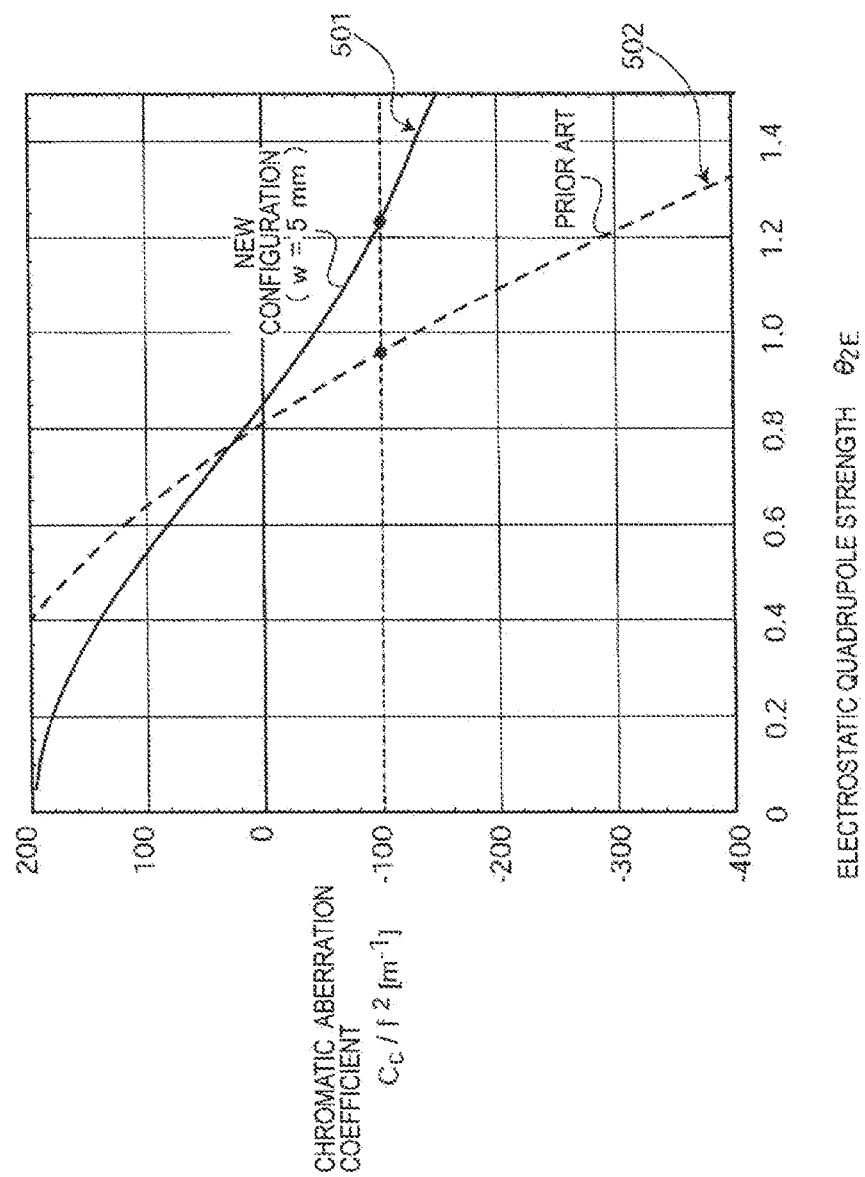

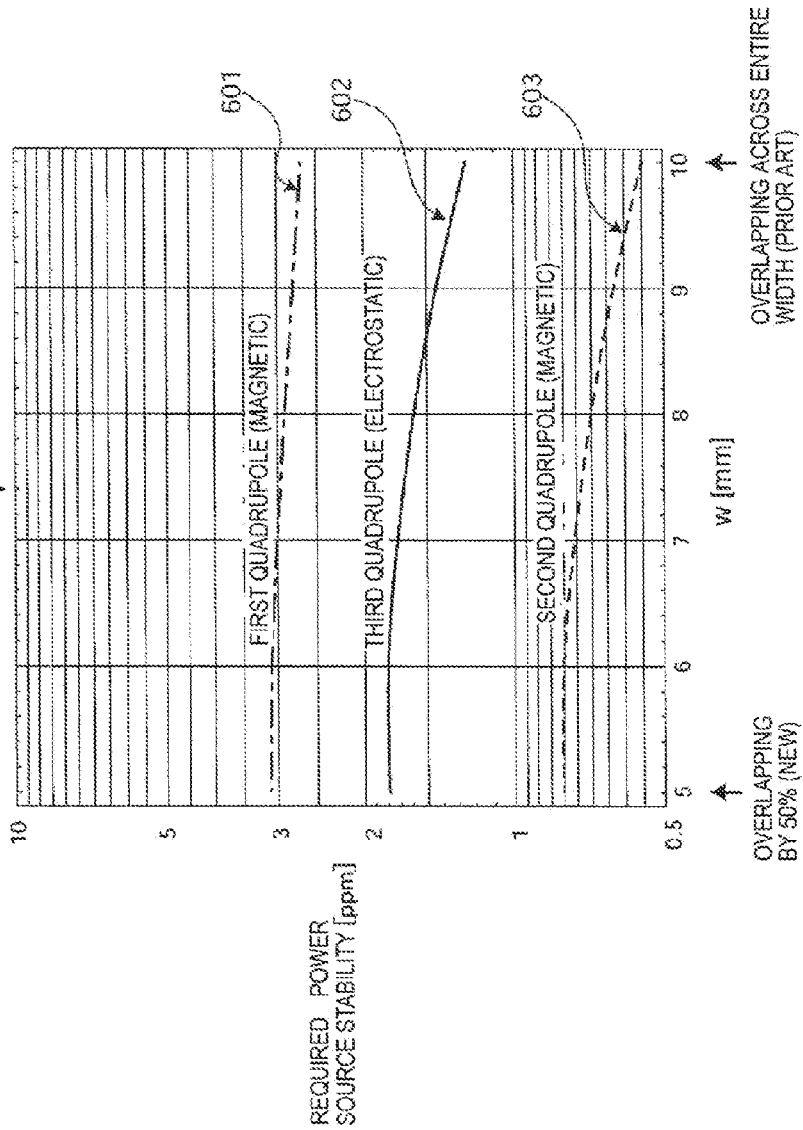

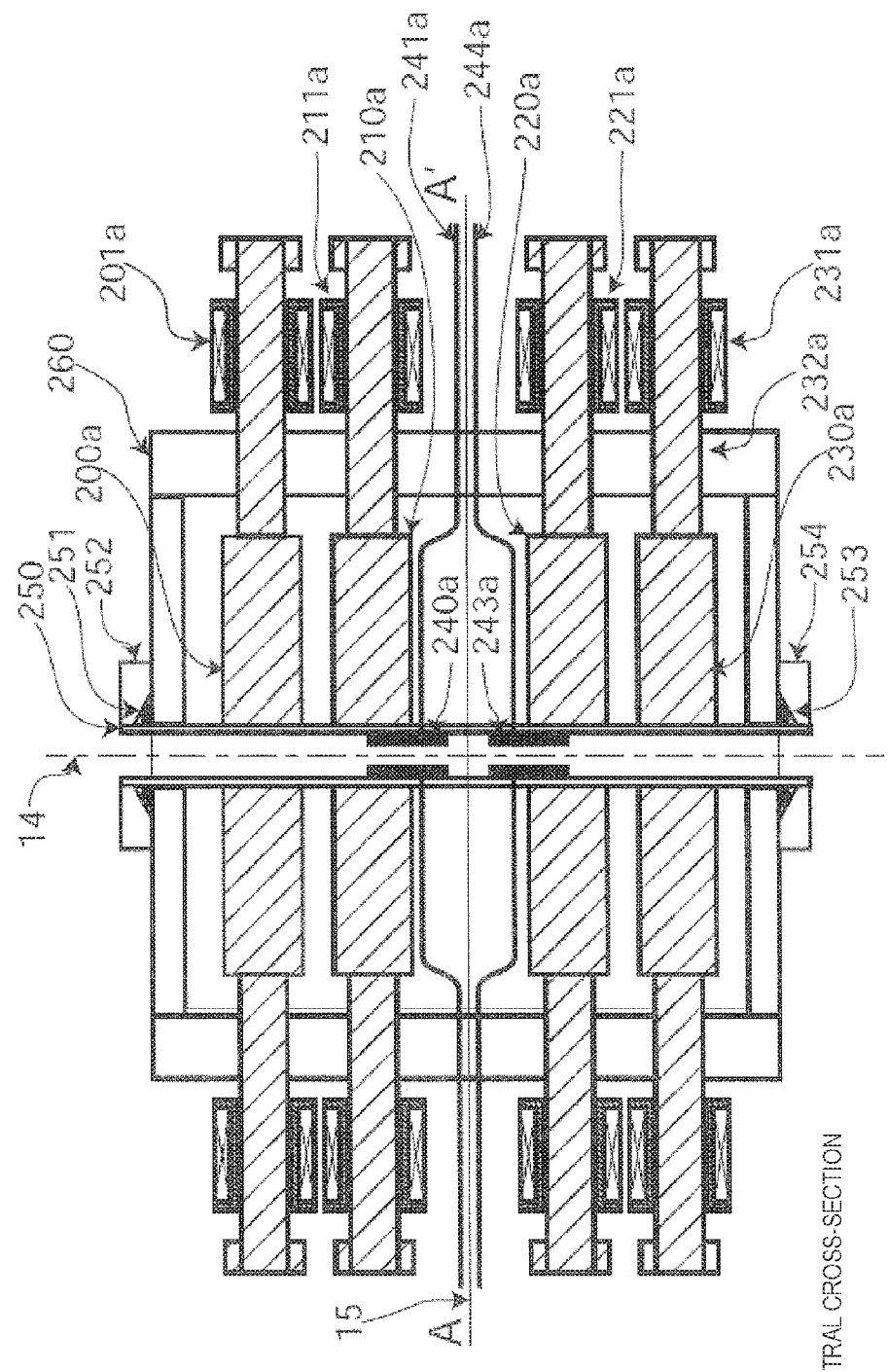

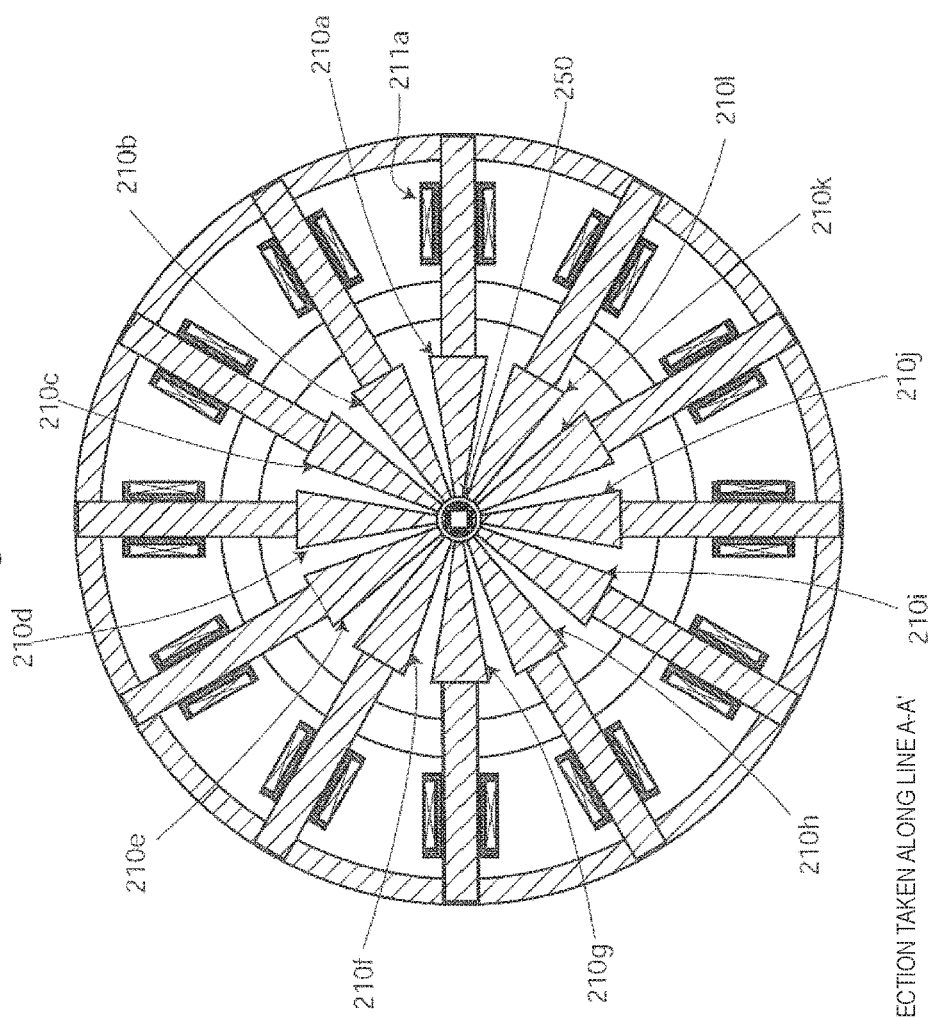

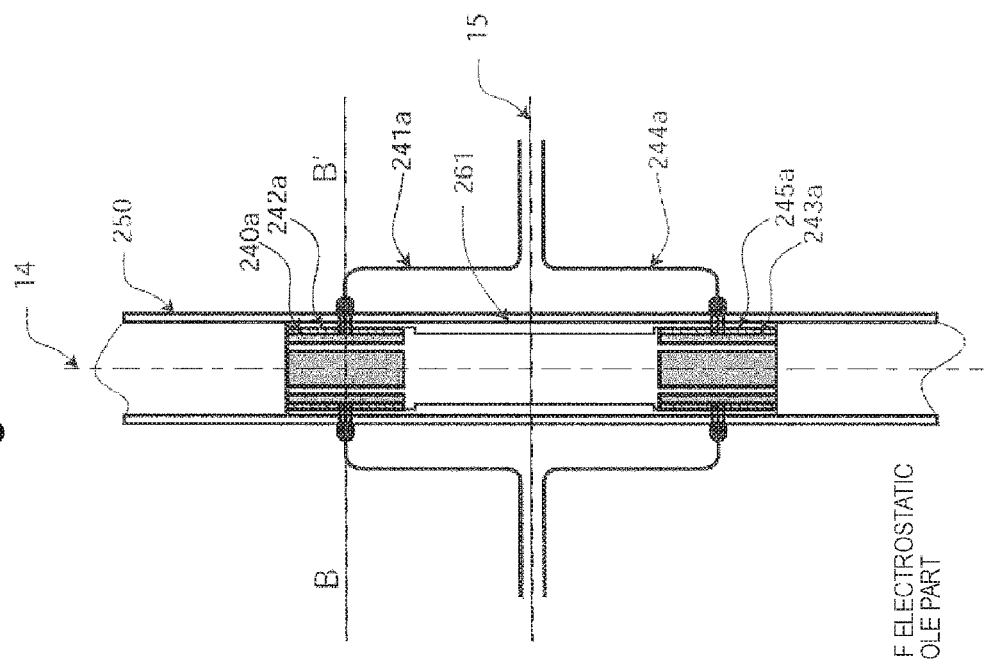

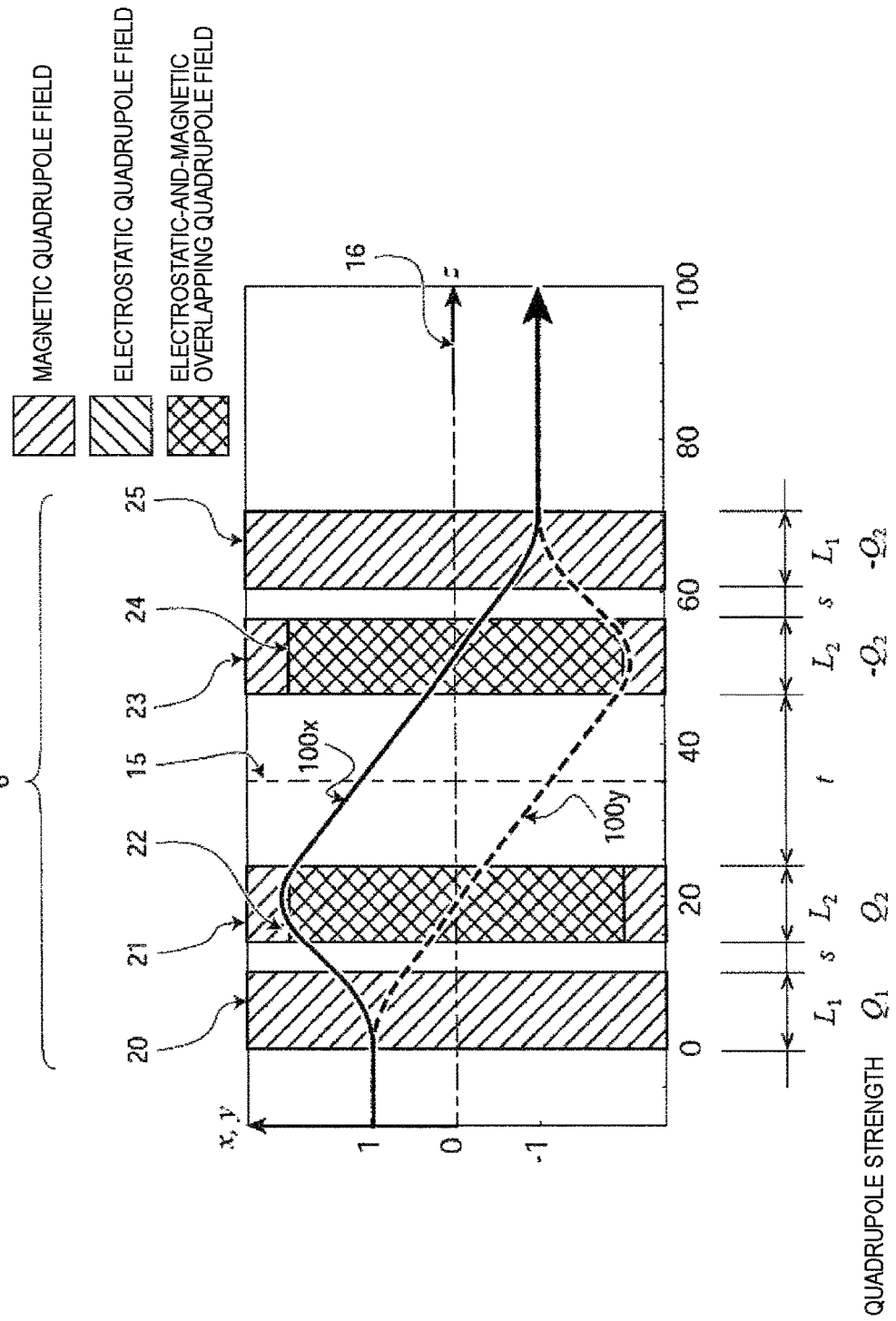

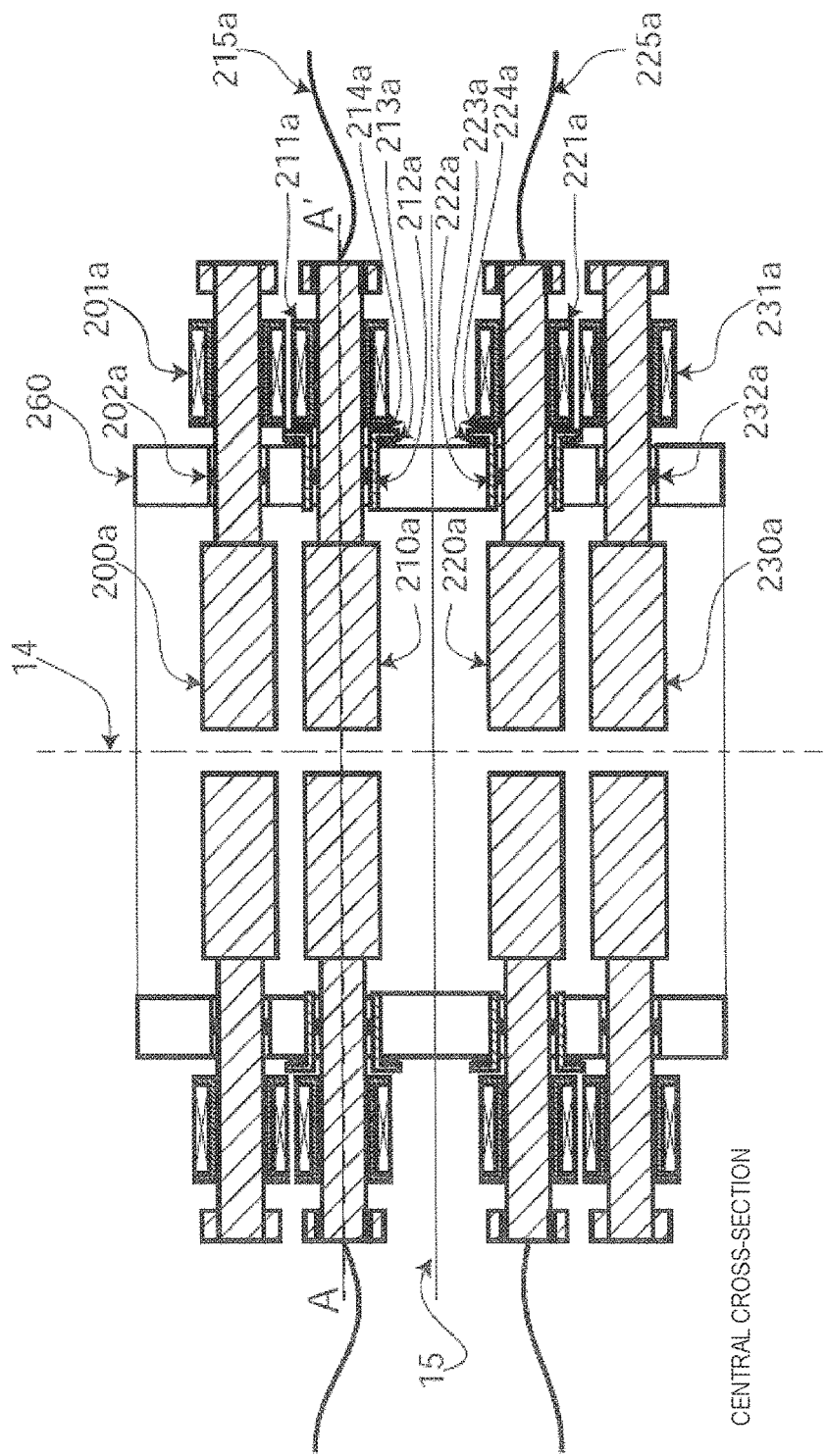

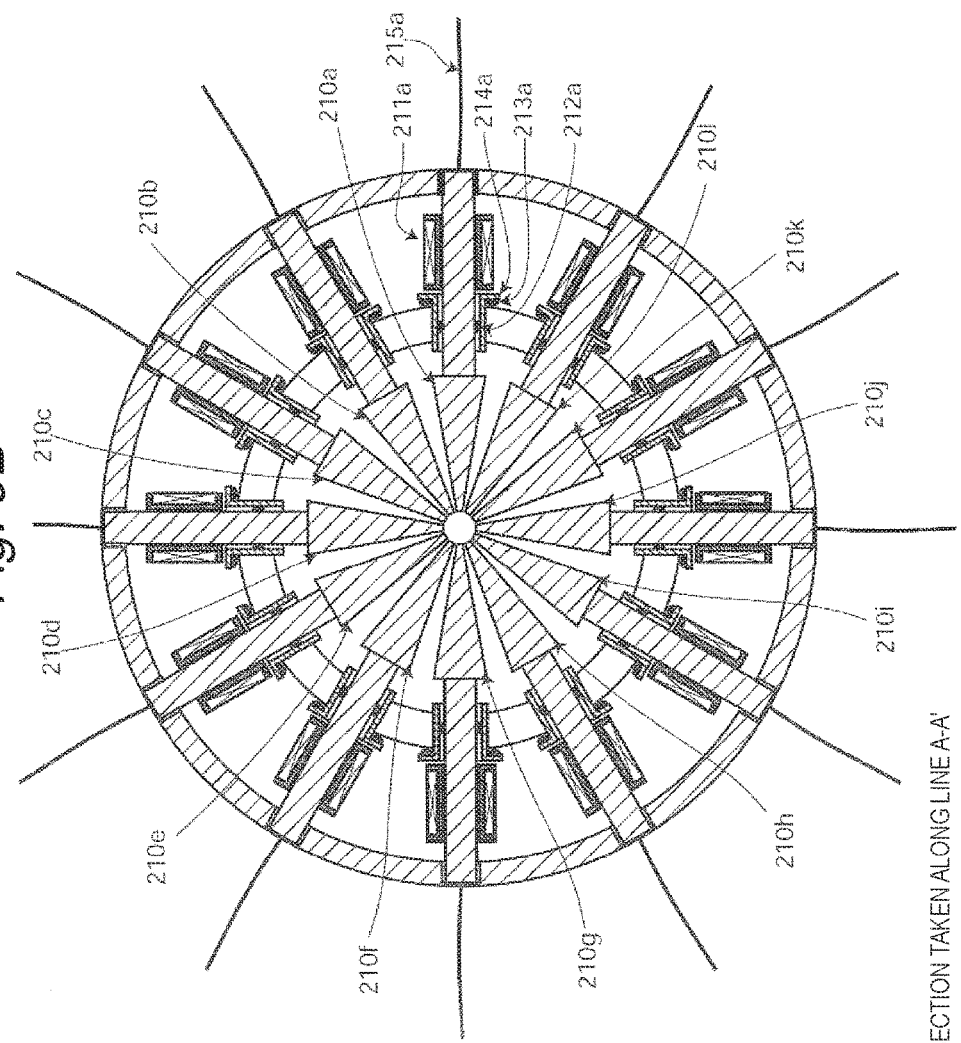

CHARGED PARTICLE BEAM APPARATUS AND ABERRATION CORRECTOR

BACKGROUND

This invention relates to a charged particle beam apparatus and an aberration corrector used in a charged particle beam apparatus.

In recent years, an electron microscope aberration correction technology using a multipole aberration corrector is already becoming popular for use with a transmission electron microscope (TEM) and a scanning transmission electron microscope (STEM). In a high acceleration TEM and STEM having electron energy of 100 kiloelectron volt or higher, a spherical aberration is corrected through use of the above-mentioned technology, to thereby allow observation with an ultrahigh resolving power under 0.1 nanometer, which has been difficult so far. Also in a scanning electron microscope, achieving a higher resolving power is approaching a limit with related-art optimization of the shape of an objective lens and related-art optimization of energy on an electronic path, for example, retarding or boosting. Therefore, in the same manner as for the TEM and STEM, an aberration correction using a multipole aberration corrector is a highly expected technology as means for improving a resolving power particularly in a low energy region exhibiting energy of 1 kiloelectron volt or lower.

However, the aberration correction using a multipole aberration corrector differs from the high acceleration TEM and STEM in that a chromatic aberration is as or more liable to be a main factor that restricts the resolving power as or than the spherical aberration because an electron beam used by an SEM has low energy. Hence, a chromatic-and-spherical aberration corrector having a configuration different from that of a hexapole spherical aberration corrector widely used for the high acceleration TEM and STEM is demanded for the SEM and a low acceleration TEM and STEM (in particular, having energy of 30 kiloelectron volt or lower).

To that end, there have been proposed so far not only an antisymmetric fourfold quadrupole chromatic-and-spherical aberration corrector, which was proposed by H. Rose and the effectiveness of which was empirically confirmed by J. Zach et at, but also a chromatic (spherical) aberration corrector having a plurality of configurations (PTL 1). Those aberration correctors include a multistage quadrupole-octupole lens having two or more stages as a basic configuration. In particular, at least a two-stage multipole within a multistage multipole that forms the above-mentioned aberration corrector is characterized by being complex electromagnetic quadrupoles each configured to cause quadrupole fields of a magnetic field and an electrostatic field to occur in the same spot in order to carry out chromatic aberration correction. The complex electromagnetic quadrupoles including those multipoles may be further able to cause an octupole, hexapole, or dipole field to occur simultaneously in order to correct an aperture aberration up to the third order, for example, a spherical aberration. Therefore, respective multipoles of a quadrupole-octupole chromatic-and-spherical aberration corrector may often include not only the above-mentioned complex electromagnetic quadrupoles but also other multipoles formed of twelve poles in actuality.

As an example of the related art, a configuration of the antisymmetric fourfold quadrupole chromatic-and-spherical aberration corrector proposed by H. Rose is illustrated in FIG. 8 as a basic example, and its operation principle is described below. A chromatic-and-spherical aberration corrector 6 (hereinafter referred to simply as "aberration corrector 6") described above includes a multipole 20, multipoles 21 and 22, multipoles 23 and 24, and a multipole 25 in four stages. As described above, complex electromagnetic quadrupoles configured to cause magnetic quadrupoles 21 and 23 and electrostatic quadrupoles 22 and 24 to occur in the same multipoles are formed in two inside stages of the four stages. The multipoles 20 and 25 before and after those complex electromagnetic quadrupoles mainly aim at guiding electrons to a trajectory suitable for chromatic aberration correction at complex electromagnetic quadrupoles 21-22 and 23-24, and an effective chromatic aberration correction itself is conducted through use of the complex electromagnetic quadrupoles 21-22 and 23-24 in two stages. Electrostatic quadrupoles are used as the multipoles 20 and 25 before and after the complex electromagnetic quadrupoles by J. Zach et al., but the multipoles 20 and 25 may be magnetic quadrupoles.

More specifically, electrons parallelly enter from the left of the aberration corrector as illustrated in FIG. 8, pass along trajectories 100x and 100y, and parallelly exit through a termination of the aberration corrector. An electron beam is also set to exhibit the same axis offset distance from a center axis at times of entering and exiting the aberration corrector. The aberration corrector is further designed to allow telescopic use without exerting an influence on an optical system outside the aberration corrector when the aberration corrector is turned on and off. In the inside of the aberration corrector 6, the electron beam entering from the left first branches off to an x-trajectory 100x and a y-trajectory 100y at the first-stage quadrupole 20, and the x-trajectory 100x passes through the second-stage complex electromagnetic quadrupole 21-22 away from the center axis. Meanwhile, the y-trajectory 100y is adjusted to pass through substantially the center of the complex electromagnetic quadrupole. When a rectangular field approximation is assumed as a field distribution, motion of electrons inside the second-stage complex electromagnetic quadrupole is described by equations of motion of Expression (1):

$$x'' = -\frac{\theta^2}{L_2^2}x$$

$$y'' = +\frac{\theta^2}{L_2^2}y$$

Expression (1)

where L represents a pole length, and θ represents a parameter indicating a quadrupole field strength as expressed by Expression (2):

$$\theta = \sqrt{\theta_M^2 + \theta_E^2} = \frac{1}{L}\sqrt{\sqrt{\frac{2e}{m\Phi_0}}\psi_2 - \frac{\phi_2}{\Phi_0}}$$

Expression (2)

where $\theta_E$ and $\theta_M$ represent parameters indicating an electrostatic quadrupole strength and a magnetic quadrupole strength, respectively, as expanded in Expression (2).

In each of coefficients $\psi_2$ and $\Phi_2$ within the third term of Expression (2), a distribution of a magnetic potential and an electrostatic potential of the quadrupole field is expressed by Expression (3).

$$\Psi_2(x,y) = 2\psi_2 xy$$

$$\Phi_2(x,y) = \phi_2(x^2 - y^2)$$

Expression (3)

In Expression (2), e and m represent a charge and a mass of electrons, and $\Phi_0$ represents energy of the electrons passing through the aberration corrector. In consideration of a distribution of electron energy, Expression (2) is transformed as Expression (4) for electrons having the energy of $\Phi_0+\delta\Phi$.

$$\theta + \delta\theta = \frac{1}{L}\sqrt{\sqrt{\frac{2e}{m(\Phi_0+\delta\Phi)}}\psi_2 - \frac{\phi_2}{(\Phi_0+\delta\Phi)}} \qquad \text{Expression (4)}$$

$$\approx \frac{1}{L}\sqrt{\sqrt{\frac{2e}{m\Phi_0}}\psi_2 - \frac{\phi_2}{\Phi_0}} -$$

$$\frac{\delta\phi}{2L\Phi_0}\left(\frac{1}{2}\sqrt{\frac{2e}{m\Phi_0}}\psi_2 - \frac{\phi_2}{\Phi_0}\right)$$

$$\left(\sqrt{\frac{2e}{m(\Phi_0+\delta\Phi)}}\psi_2 - \frac{\phi_2}{(\Phi_0+\delta\Phi)}\right)^{-\frac{1}{2}}$$

In conversion into the third term of Expression (4), $\delta\Phi$ is left up to its linear expression as a minute amount. Hence, its approximation is expressed as Expression (5):

$$\delta\theta = -\frac{\delta\Phi}{4L\Phi_0}\frac{\theta_M - 2\theta_E}{\theta} \qquad \text{Expression (5)}$$

where $\delta\theta$ represents a change of a quadrupole strength relative to a change (distribution) of electron energy. In other words, the two expressions of Expression (2) and Expression (5) mean that it is possible to adjust a dispersion (namely, Expression (5)) arbitrarily between positive and negative while maintaining a total strength (namely, Expression (2)) at a fixed value through use of the complex electromagnetic quadrupole. As a result, it is possible to form a convex lens having a negative dispersion in an x-direction with the second quadrupole 21-22 being an electromagnetic complex to impart a negative chromatic aberration to electrons on the x-trajectory 100x. In other words, dependence on the electron energy $\Phi_0$ is different between the electrostatic quadrupole and the magnetic quadrupole, and hence it can be said that, in the x-direction, a convex lens and a concave lens are formed with the magnetic quadrupole and the electrostatic quadrupole, respectively, and a convex lens having a negative dispersion is formed as a residual of cancellation of both to create a negative chromatic aberration. Meanwhile, as pointed out above, the y-trajectory 100y is adjusted to pass through the center of the second quadrupole 21-22, and therefore passes through the second quadrupole 21-22 almost without undergoing an influence of the quadrupole including an aberration.

In the same manner, the third quadrupole 23-24 being an electromagnetic complex is set so that the x-trajectory 100x passes through the center of the quadrupole and the y-trajectory 100y passes through a spot spaced apart from the center axis such that the third quadrupole 23-24 becomes antisymmetric with the second quadrupole 21-22. Those settings can impart a negative chromatic aberration to electrons on the y-trajectory 100y in contrast to the previous passage. The electrons that have branched off to follow an x-trajectory and a y-trajectory so far are stigmatically integrated at the fourth quadrupole 25 again to exit the aberration corrector 6. As a result, the above-mentioned antisymmetric fourfold quadrupole aberration corrector can provide a chromatic aberration that exhibits equal amounts in the x-direction and a y-direction and can therefore be adjusted rotationally symmetrically and arbitrarily between positive and negative. The antisymmetric fourfold quadrupole aberration corrector can further cancel out the above-mentioned chromatic aberration and a (positive) chromatic aberration of an objective lens 11 located optically downstream of the aberration corrector 6, to thereby achieve the chromatic aberration correction as an entire SEM optical system.

In addition to the above-mentioned correction, by superimposing and applying an appropriate octupole field to each of the multipoles in four stages of the aberration corrector 6, it is possible to correct a third-order aperture aberration including a spherical aberration. It is also possible to compensate first-order and second-order parasitic aberrations, which appear due to imperfection of the optical system from the inside and outside of the aberration corrector, by appropriately applying a hexapole field and a dipole field to the respective stages in the same manner. With the above-mentioned configuration, the chromatic aberration and the aperture aberration up to the third order can be corrected by the antisymmetric fourfold quadrupole aberration corrector.

In order to maintain a symmetric property with respect to the x-trajectory and the y-trajectory described above, the four-stage quadrupole of the aberration corrector further causes a fourth-order or higher-order aberration to be canceled out inside the aberration corrector by the symmetric property. Hence, the first stage 20 and the fourth stage 25, as well as the second stage 21-22 and the third stage 23-24, are arranged symmetrically with respect to a corrector center plane 15 inside the aberration corrector, and are simultaneously excited antisymmetrically. In other words, the above-mentioned four-stage multipole forms an antisymmetric fourfold quadrupole.

CITATION LIST

Patent Literature 1: JP 2010-114068 A

SUMMARY

As described above in the "BACKGROUND OF THE INVENTION" section, in order to conduct chromatic aberration correction, a multistage multipole aberration corrector is formed so as to include at least two complex electromagnetic quadrupoles, and is configured to cancel out a negative chromatic aberration generated by the complex electromagnetic quadrupoles and a positive chromatic aberration that is a problem to be caused in a charged particle optical system, for example, an objective lens, of an SEM including the multistage multipole aberration corrector, to thereby achieve the chromatic aberration correction.

A large number of chromatic-and-spherical aberration correctors that have been proposed so far (for example, PTL 1) vary in terms of the number of included multipoles and the number of optical elements, but all have a principle for correcting a chromatic aberration based on generation of the negative chromatic aberration by the complex electromagnetic quadrupoles described above. Hence, those multistage multipole aberration correctors including the complex electromagnetic quadrupoles have similar features and thus similar problems. In particular, the above-mentioned multistage multipole aberration correctors are required to exhibit theoretically higher machine accuracy than that of a hexapole spherical aberration corrector that has already been used for a high acceleration TEM and STEM, while in actuality, structure having a combination of multipoles in a larger number of stages becomes more complicated and harder to maintain sufficient mechanical accuracy with. This still remains a major problem for actual use of the chromatic-and-spherical aberration corrector of the above-mentioned model.

An example of mechanically complicated structure of the related-art chromatic-and-spherical aberration corrector described above is illustrated in FIG. 9A and FIG. 9B. In particular, the second and third multipoles cannot avoid having complicated structure as illustrated in FIG. 9A and FIG. 9B due to necessity of the multipoles being electromagnetic complexes. In other words, as illustrated in FIG. 9A and FIG. 9B, in order that a multipole of the second-stage multipole forms an electrostatic quadrupole field in a vacuum part in the vicinity of a center axis 14, a pole 210a needs to have a tip exposed to the inside of a vacuum. Moreover, sufficient electrical insulation needs to be maintained between poles or between a pole and a support member 260.

Meanwhile, the pole 210a also serves as a magnetic pole, and therefore needs to be provided with a coil 211a configured to excite the pole 210a. An exciting coil has a large surface area that leads to outgassing and causes heating due to energization, and hence it is desired that the exciting coil be placed outside the vacuum if possible.

To summarize the requirements for a mechanical configuration of those complex electromagnetic quadrupoles, the tip of the pole 210a is placed inside the vacuum, and another end of the pole 210a is placed on an atmosphere side and crosses the support member 260 because the exciting coil 211a is provided at the end of the pole 210a. Moreover, electrical insulation needs to be maintained across an insulating sleeve 214a between the support member 260 and the pole 210a. It should be understood that vacuum sealing needs to be conducted at the above-mentioned spot, and hence O-rings (mechanical parts for sealing, a cross-section of which has a circular annular shape) are doubly sandwiched at two spots of the pole 210a of an electromagnetic complex both between the pole 210a and the insulating sleeve 214a and between the insulating sleeve 214a and the support member 260. In such complicated multipole structure, it can be said that it is extremely difficult to achieve structure that satisfies such functions of electrical insulation and vacuum sealing as described above while maintaining arrangement accuracy of the tip of the multipole to the micrometer order and simultaneously maintaining a magnetically uniform conduction across the entire multipole.

In addition to an increase in complexity of the aberration corrector structure, there is also a problem in that a power source stability for driving a multistage multipole chromatic-and-spherical aberration corrector is higher by at least one order because the multistage multipole chromatic-and-spherical aberration corrector includes a complex electromagnetic quadrupole unlike the hexapole spherical aberration corrector for the high acceleration TEM and STEM or for other such reasons. In general, a power source exhibiting stability of from $10^{-5}$ to $10^{-6}$ is necessary for driving the hexapole spherical aberration corrector, while a power source exhibiting stability higher than from $10^{-7}$ to $10^{-8}$ is required for the chromatic-and-spherical aberration corrector.

Therefore, one object of this invention is to simplify the complicated mechanical structure described above as much as possible, and to facilitate an increase in mechanical arrangement accuracy of the tip of the multipole and magnetic uniformity of the entire multipole.

Another object of this invention is to alleviate the required power source stability of a drive power source, which is necessary for the multistage multipole chromatic-and-spherical aberration corrector including a complex electromagnetic multipole of the same kind, to a level lower than that of the related art.

In order to solve the above problem, an aspect of this invention is a charged particle beam apparatus, which is configured to irradiate a sample with a charged particle beam to detect a charged particle ascribable to the sample, the charged particle beam apparatus comprising an aberration correction unit, the aberration correction unit comprising: a first magnetic multipole and a second magnetic multipole; a third magnetic multipole and a fourth magnetic multipole that are provided between the first magnetic multipole and the second magnetic multipole; and a first electrostatic multipole and a second electrostatic multipole that are provided between the first magnetic multipole and the second magnetic multipole, wherein: the first magnetic multipole, the second magnetic multipole, the third magnetic multipole, and the fourth magnetic multipole and the first electrostatic multipole and the second electrostatic multipole are arranged symmetrically with respect to a center symmetry plane, and are respectively excited antisymmetrically; the second magnetic multipole is provided in a first plane that is different from a second plane in which the first electrostatic multipole is provided; the third magnetic multipole is provided in a third plane that is different from a fourth plane in which the second electrostatic multipole is provided; and the aberration correction unit is arranged on one of a path for irradiating the sample with the charged particle beam and a path for detecting the charged particle ascribable to the sample.

Another aspect of this invention is a charged particle beam apparatus, which is configured to irradiate a sample with a charged particle beam to detect a charged particle ascribable to the sample, the charged particle beam apparatus comprising an aberration correction unit, the aberration correction unit comprising: a first magnetic multipole and a second magnetic multipole; a third magnetic multipole and a fourth magnetic multipole that are provided between the first magnetic multipole and the second magnetic multipole; and a first electrostatic multipole and a second electrostatic multipole that are provided between the first magnetic multipole and the second magnetic multipole, wherein: the first magnetic multipole, the second magnetic multipole, the third magnetic multipole, and the fourth magnetic multipole and the first electrostatic multipole and the second electrostatic multipole are arranged symmetrically with respect to a center symmetry plane, and are respectively excited antisymmetrically; the second magnetic multipole exerts an action on a magnetic field having a width that is different from a width of an electric field on which the first electrostatic multipole exerts an action; the third magnetic multipole exerts an action on a magnetic field having a width that is different from a width of an electric field on which the second electrostatic multipole exerts an action; and the aberration correction unit is arranged on one of a path for irradiating the sample with the charged particle beam and a path for detecting the charged particle ascribable to the sample.

Another aspect of this invention is a charged particle beam apparatus, which is configured to irradiate a sample with a charged particle beam to detect a charged particle ascribable to the sample, the charged particle beam apparatus comprising an aberration correction unit comprising at least four stages of multipoles each provided in a plane, the aberration correction unit comprising: a first magnetic multipole provided in a first plane; a second magnetic multipole provided in a second plane below the first plane; a third magnetic multipole provided in a third plane below the second plane; a fourth magnetic multipole provided in a fourth plane below the third plane; and a first electrostatic multipole and a second electrostatic multipole, which are provided between the first magnetic multipole and the second magnetic multipole, and are excited antisymmetrically with respect to a center symmetry plane of the aberration correction unit, wherein: the aberration correction unit is configured to form: a first field in which a first electric field generated by the first electrostatic multipole and a first magnetic field generated by the second magnetic multipole are superimposed on each other; a second field in which one of the first electric field and the first magnetic field solely exerts an action; a third field in which a second electric field generated by the second electrostatic multipole and a second magnetic field generated by the third magnetic multipole are superimposed on each other; and a fourth field in which one of the second electric field and the second magnetic field solely exerts an action; and the aberration correction unit is arranged on one of a path for irradiating the sample with the charged particle beam and a path for detecting the charged particle ascribable to the sample.

Another aspect of this invention is an aberration corrector, comprising: a first magnetic multipole and a second magnetic multipole; a third magnetic multipole and a fourth magnetic multipole that are provided between the first magnetic multipole and the second magnetic multipole; and a first electrostatic multipole and a second electrostatic multipole that are provided between the first magnetic multipole and the second magnetic multipole, wherein: the first magnetic multipole, the second magnetic multipole, the third magnetic multipole, and the fourth magnetic multipole and the first electrostatic multipole and the second electrostatic multipole are arranged symmetrically with respect to a center symmetry plane, and are respectively excited antisymmetrically; the second magnetic multipole is provided in a first plane that is different from a second plane in which the first electrostatic multipole is provided; and the third magnetic multipole is provided in a third plane that is different from a fourth plane in which the second electrostatic multipole is provided.

Another aspect of this invention is an aberration corrector, comprising: a first magnetic multipole and a second magnetic multipole; a third magnetic multipole and a fourth magnetic multipole that are provided between the first magnetic multipole and the second magnetic multipole; and a first electrostatic multipole and a second electrostatic multipole that are provided between the first magnetic multipole and the second magnetic multipole, wherein: the first magnetic multipole, the second magnetic multipole, the third magnetic multipole, and the fourth magnetic multipole and the first electrostatic multipole and the second electrostatic multipole are arranged symmetrically with respect to a center symmetry plane, and are respectively excited antisymmetrically; the second magnetic multipole exerts an action on a magnetic field having a width that is different from a width of an electric field on which the first electrostatic multipole exerts an action; and the third magnetic multipole exerts an action on a magnetic field having a width that is different from a width of an electric field on which the second electrostatic multipole exerts an action.

According to this invention, it is possible to simplify the complicated mechanical structure and improve the accuracy of the multipole.

BRIEF DESCRIPTION OF THE DRAWINGS

FIG. 4 is a graph for showing that a stabler chromatic aberration correction can be achieved through use of an aberration corrector configuration according to the embodiment of this invention than through use of a related-art configuration.

FIG. 5 is a graph for showing that a power source stability required for driving the aberration corrector becomes lower through use of an aberration corrector configuration according to the embodiment of this invention than through use of the related-art configuration.

FIG. 6A is a diagram for illustrating an example (vertical section) of mechanical structure of the antisymmetric multi-quadrupole chromatic-and-spherical aberration corrector according to the embodiment of this invention illustrated in FIG. 2.

FIG. 6B is a diagram for illustrating the example (horizontal section) of the mechanical structure of the antisymmetric multi-quadrupole chromatic-and-spherical aberration corrector according to the embodiment of this invention illustrated in FIG. 2.

FIG. 7A is a diagram for illustrating a configuration example (vertical section) of an electrostatic quadrupole part within the mechanical structure exemplified in FIG. 6A according to the embodiment of this invention.

FIG. 8 is a diagram for illustrating a pole configuration of a related-art antisymmetric quadrupole chromatic-and-spherical aberration corrector and an electron trajectory for an aberration correction.

FIG. 9A is a diagram for illustrating an example (vertical section) of mechanical structure of the related-art antisymmetric quadrupole chromatic-and-spherical aberration corrector.

FIG. 9B is a diagram for illustrating the example (horizontal section) of the mechanical structure of the related-art antisymmetric quadrupole chromatic-and-spherical aberration corrector.

DETAILED DESCRIPTION OF THE EMBODIMENTS

Figure 1:
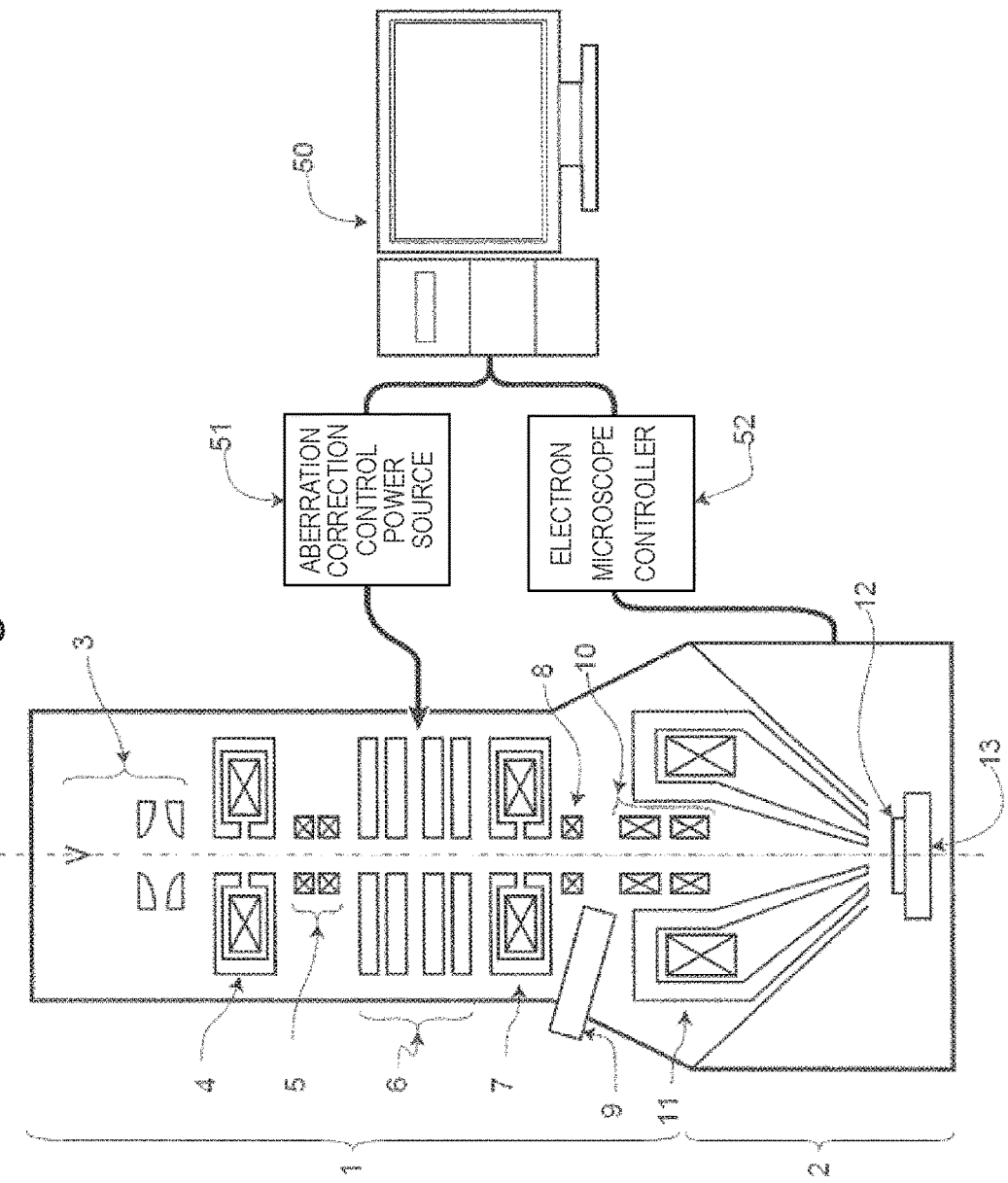
FIG. 1 is a diagram for illustrating an example of a general configuration of an SEM including an aberration corrector of a multistage multipole.

This invention relates to a charged particle optical apparatus requiring a high resolving power, and more particularly, to an apparatus using a charged particle having energy low enough to impose a limitation on its resolving power mainly due to a chromatic aberration, and provides a chromatic-and-spherical aberration corrector having required power source accuracy that is lower than in the related art and a simple mechanical configuration. The following description is made by assuming use for a low acceleration scanning electron microscope (SEM) and a scanning transmission electron microscope (STEM), to which this invention is not particularly limited.

A basic solution presented by this invention is to separate a complex electromagnetic multipole included in a related-art multistage multipole chromatic-and-spherical aberration corrector into an individual electrostatic multipole and an individual magnetic multipole, and to provide a difference in a position or a width between both on an electron beam path. First, this allows, as described above, the complex electromagnetic multipole having complicated structure to be eliminated, and a simple electrostatic multipole and a simple magnetic multipole to be separately arranged inside and outside a vacuum. With this configuration, complicated electrical insulation and vacuum sealing structure that are required for forming the complex electromagnetic multipole can be avoided, and are expected to be simplified. This also allows improvement in mechanical assembly accuracy of a multistage multipole aberration corrector to be expected. Specific configuration examples of a multistage multipole chromatic-and-spherical aberration corrector according to one embodiment of this invention are described below with reference to FIG. 6A, FIG. 6B, FIG. 7A, and FIG. 7B.

Specifically, a charged particle beam apparatus according to the embodiment of this invention is a charged particle beam apparatus configured to irradiate a sample with a charged particle beam to detect a signal including, for example, a charged particle or an electromagnetic wave generated from the sample accordingly, and includes a multistage multipole chromatic-and-spherical aberration corrector configured to further reduce an irradiation diameter of the charged particle beam on the sample. The multistage multipole chromatic-and-spherical aberration corrector has, as a basic configuration, structure including a pair of two magnetic multipoles configured to generate at least a quadrupole field at both its ends or at positions near both the ends, and further including a pair of two magnetic multipoles and a pair of two electrostatic multipoles that are different from the four magnetic multipoles between the pairs of magnetic multipoles.

For the sake of convenience in the following description, the four magnetic multipoles are referred to as "first magnetic multipole", "second magnetic multipole", "third magnetic multipole", and "fourth magnetic multipole" in order from an entrance end of the charged particle beam and its exit end, and the two electrostatic multipoles are similarly referred to as "first electrostatic multipole" and "second electrostatic multipole" in order from the entrance end side. It is assumed that a pair of the first magnetic multipole and the fourth magnetic multipole, a pair of the second magnetic multipole and the third magnetic multipole, and a pair of the first electrostatic multipole and the second electrostatic multipole are respectively arranged symmetrically with respect to a center plane of the aberration corrector, and have a function of forming a quadrupole field having antisymmetric strength. In this case, the second electrostatic multipole and the first magnetic multipole or the third electrostatic multipole and the second magnetic multipole form a quadrupole field having the same distribution at the same spot on a charged particle path, and hence structure that uses common multipoles as both the respective electrostatic multipoles and the respective magnetic multipoles is employed, and the above-mentioned complex electromagnetic multipole is obtained. In this case, the structure to be implemented becomes complicated, and machine accuracy to be required becomes hard to satisfy, as described in the "SUMMARY OF THE INVENTION" section.

Therefore, first means according to the embodiment of this invention includes arranging the second magnetic multipole and the first electrostatic multipole or the third magnetic multipole and the second electrostatic multipole in such positions as not to overlap completely with each other on the charged particle path while maintaining a symmetric property of the arrangement and an antisymmetric property of excitation with respect to the center plane of the aberration corrector described above. This includes a case where the second magnetic multipole and the first electrostatic multipole (as well as the third magnetic multipole and the second electrostatic multipole, so as to maintain the symmetric property) are arranged with a partial overlap.

Further, second means according to the embodiment of this invention includes creating a difference in a pole length (action length of the multipole along the charged particle path) between the second magnetic multipole and the first electrostatic multipole or the third magnetic multipole and the second electrostatic multipole and creating a difference in a distribution of multipole fields of both the electrostatic multipole and the magnetic multipole while maintaining the symmetric property of the arrangement and the antisymmetric property of the excitation with respect to the center plane of the aberration corrector described above. Another means according to the embodiment of this invention combines the first means and the second means described above, and includes changing both positions and pole lengths of the second magnetic multipole and the first electrostatic multipole or the third magnetic multipole and the second electrostatic multipole.

Through application of this invention, the complex electromagnetic multipole having the complicated structure can be eliminated and replaced by a combination of the electrostatic multipoles and the magnetic multipoles. While a main body of the electrostatic multipole is set inside a vacuum, the magnetic multipole can be arranged outside the vacuum along with a coil group required for the excitation through use of a vacuum chamber made of a non-magnetic material, to thereby greatly simplify the complicated electrical insulation or the complicated structure for vacuum sealing, which is required for the complex electromagnetic multipole. With this configuration, it is possible to achieve improvement in machine accuracy of each of the electrostatic multipoles and the magnetic multipoles.

In addition, the length of an overlap between the second (third) magnetic multipole and the first (second) electrostatic multipole or a difference in the pole length between both, which is an arbitrarily adjustable parameter, is newly introduced, to thereby enable the adjustment of a chromatic aberration correction amount and a relationship between a current and a voltage of a drive power source required for the correction through use of the above-mentioned parameter. It is also possible to alleviate a required stability of a power source, which is necessary for chromatic aberration correction, by adjusting the above-mentioned parameter as described in detail in a specific example of this invention.

Further, another object of this invention is to alleviate the stability and accuracy level required of the power source configured to drive the corrector. Specific numerical values thereof change depending on the actual configuration of the multistage multipole aberration corrector, the configuration of the charged particle beam apparatus using the multistage multipole aberration corrector, the kind and energy of charged particles to be corrected, and the like, but in the related-art multistage multipole chromatic-and-spherical aberration corrector using a complex electromagnetic quadrupole for chromatic aberration correction, corresponding parts of a convex lens of a magnetic quadrupole and a concave lens of an electrostatic quadrupole that are generated in the complex electromagnetic multipole are canceled out, and a negative chromatic aberration is achieved as a lens action left as a residual, as described in the "BACKGROUND OF THE INVENTION" section as the principle of the chromatic aberration correction.

Therefore, it can be understood that higher accuracy is required for the magnetic quadrupole and the electrostatic quadrupole for causing a negative chromatic aberration in order to obtain a negative chromatic aberration sufficient for practical use. As an actual example, in order to drive a hexapole spherical aberration corrector for a high acceleration TEM and STEM out of the aberration correctors that have been developed so far, the power source having a stability of $\delta I/I \approx$ (from $10^{-5}$ to $10^{-6}$) is required, while a power source having a stability of $(\delta V/V, \delta I/I) \approx$ (from $10^{-7}$ to $10^{-8}$), which is higher than that of the above-mentioned aberration correctors, is required in the multistage multipole chromatic-and-spherical aberration corrector using the complex electromagnetic quadrupole. In the above-mentioned expressions, $\delta V/V$ and $\delta I/I$ represent a required stability of a voltage source and a current source including a ripple.

In contrast, in the embodiment of this invention, as a result of separating the complex electromagnetic multipole into an individual magnetic multipole and an individual electrostatic multipole, it was found that the power source accuracy required for the chromatic aberration correction can be adjusted with differences between positions and widths of those being used as adjustment parameters, and can be alleviated by from 40% to 50% depending on conditions.

Now, this invention is described in detail with reference to the accompanying drawings.

First, FIG. 1 is an illustration of a general apparatus configuration of an SEM to which the multistage multipole aberration corrector is mounted according to the embodiment of this invention. The SEM includes a lens barrel section 1. The lens barrel section 1 includes: an electron gun 3 including an electron source; an objective lens 11 configured to converge, reduce, and project electrons emitted by the electron gun 3 on a sample 12 to form a minute electron probe; and a converging lens 4 and an intermediate lens 7 (second converging lens) configured to guide the electron to an objective lens along an appropriate trajectory. The converging lens 4 and the intermediate lens 7 are arranged between the electron gun 3 and the objective lens 11. The converging lens 4 can be used in more stages for the purpose of further increasing a reduction ratio or other such purpose.

The lens barrel section 1 further includes: a scanning coil 10 configured to conduct scanning (raster scanning) of the electron probe formed as described above on a sample surface; and a detector 9 configured to detect secondary electrons and reflected electrons emitted from the sample surface by the electron probe (in FIG. 1, the detector 9 exemplifies a secondary electron detector). The sample 12 is observed by being placed on a sample holder 13 capable of horizontal movement and tilting inside a sample chamber 2. The strength of the secondary electron or the like obtained by scanning the sample surface with the electron probe is sent to a control console 50, and can be observed and recorded by being two-dimensionally mapped based on raster scanning being performed again, that is, observed and recorded as an SEM image. The control console 50 referred to in this case includes a control unit and an input/output unit.

In the case of such an SEM, a multistage multipole aberration corrector 6 (hereinafter referred to simply as "aberration corrector 6") is located upstream of the objective lens 11 in order to mainly correct a chromatic aberration and a spherical aberration of the objective lens 11. Moreover, for the purpose of suppressing an occurrence of a combined aberration of the aberration corrector 6 and the objective lens 11, the aberration corrector 6 is often arranged further above the intermediate lens 7 as illustrated in FIG. 1. The aberration corrector 6 is driven by an aberration correction control power source 51, while the aberration correction control power source 51 itself may be controlled by a control unit that is the same as or separate from that of an electron microscope main body controller 52 (or may be included in the above-mentioned control console 50). In FIG. 1, a case where both are controlled by the same control console 50 is exemplified. In addition, as the need arises, the SEM may include an electron energy adjustment mechanism, for example, boosting or retarding, and a signal detector, for example, EDX, other than that exemplified above. Needless to say, although not shown in FIG. 1, those optical systems can be added within the scope of this invention.

In FIG. 8, a configuration of an antisymmetric fourfold quadrupole aberration corrector is illustrated as an example of the related-art multistage multipole chromatic-and-spherical aberration corrector as described above. The structure and the aberration correction principle illustrated in FIG. 8 are included in related-art technology. As illustrated in FIG. 8, a four-stage multipole is arranged symmetrically with respect to a corrector center plane 15 of the aberration corrector 6 being used as a symmetry plane, and the second stage 21-22 and the third stage 23-24 within the four-stage multipole are each a complex electromagnetic multipole for the chromatic aberration correction. The four-stage multipole including those stages is configured to excite an antisymmetric fourfold quadrupole antisymmetric with respect to the corrector center plane 15. The electrons inside the aberration corrector 6 are caused to astigmatically branch off into an x-trajectory 100x and a y-trajectory 100y at a first-stage quadrupole 20 to follow the respective antisymmetric trajectories, and as described already, negative chromatic aberrations in an x-direction and a y-direction are imparted by the second stage multipole 21-22 and the third stage multipole 23-24, respectively, that form the complex electromagnetic quadrupoles.

The negative chromatic aberration exhibits equal amounts in the x-direction and the y-direction, that is, is rotationally symmetric, based on the above-mentioned symmetric properties of the pole arrangement and the excitation. The x-trajectory 100x and the y-trajectory 100y are integrated in the fourth stage multipole 25 so as to become rotationally symmetric again. The negative chromatic aberration created by the aberration corrector 6 in the above-mentioned process and a positive chromatic aberration of the objective lens 11 are canceled out to achieve the chromatic aberration correction as described above. In the same manner, by appropriately superimposing a dipole field, a hexapole field, or an octupole field on the four-stage multipole, it is possible to correct not only the spherical aberration but also an aperture aberration up to the third order including a parasitic aberration due to imperfection of a system.

Figure 2:
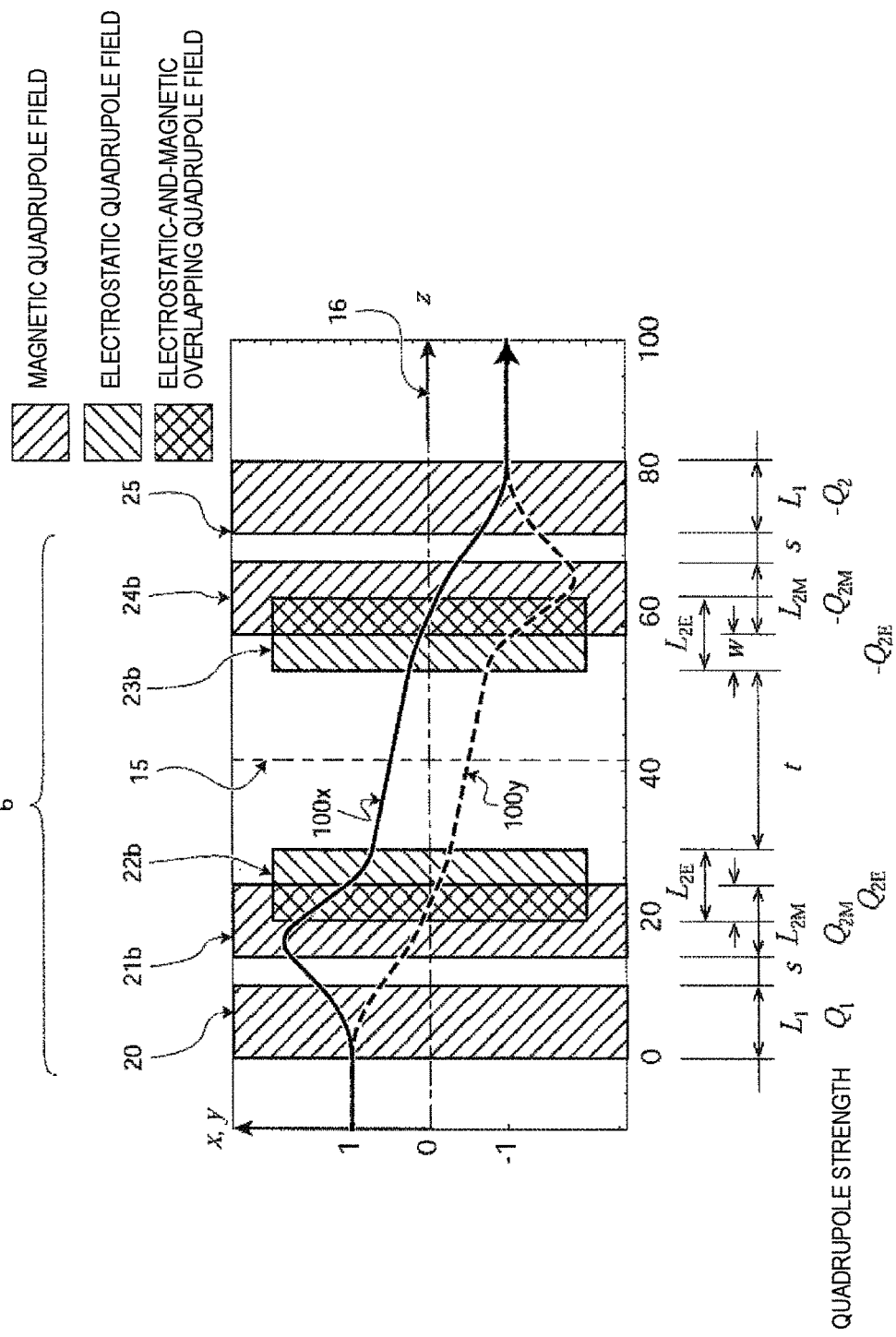
FIG. 2 is a diagram for illustrating one pole configuration of an antisymmetric multi-quadrupole chromatic-and-spherical aberration corrector according to one embodiment of this invention and an electron trajectory for aberration correction.

Meanwhile, FIG. 2 is an illustration of an example of the configuration of the aberration corrector 6 according to the embodiment of this invention. In the example of FIG. 2, the complex electromagnetic multipoles in the second stage and the third stage are separated into magnetic multipoles 21b and 24b and electrostatic multipoles 22b and 23b, and positions to be acted on by the magnetic multipole and the electrostatic multipole are displaced. As a requirement for maintaining the symmetric properties and antisymmetric properties of a pole configuration and excitation with respect to the corrector center plane 15, the electrostatic multipole 22b is arranged in the second stage by being displaced from the magnetic multipole 21b by +w in a z-direction, and in the same manner, the electrostatic multipole 23b is arranged in the third stage by being displaced from the magnetic multipole 24b by −w.

In the same manner as in the case of a related-art antisymmetric fourfold quadrupole corrector, the electrons passing through the aberration corrector 6 are caused to branch off at the first quadrupole 20 into the x-direction and the y-direction, and follow the respective trajectories 100x and 100y to pass through the inside of the corrector. The respective trajectories 100x and 100y pass through the second group multipoles 21b and 22b and the third group multipoles 23b and 24b while maintaining the symmetric property. In other words, in the second group 21b and 22b, the x-trajectory passes with a distance from a center axis 16, and the y-trajectory passes relatively in the vicinity of the center axis 16. In the third group 23b and 24b, the x-trajectory passes in the vicinity of the center axis 16, and the y-trajectory passes with a distance from the axis antisymmetrically compared to the passage through the second group.

Negative chromatic aberrations are generated in the x-direction in the second group multipoles 21b and 22b and in the y-direction in the third group multipoles 23b and 24b, and when exiting the aberration corrector 6, an electron beam is imparted a negative chromatic aberration exhibiting equal values in both the x-direction and the y-direction, that is, being rotationally symmetric, based on the above-mentioned symmetric properties of the multipoles and the trajectories. The negative chromatic aberration and the positive chromatic aberration of the objective lens 11 cancel each other out, to thereby achieve the chromatic aberration correction. An effect of an aberration corrector configuration according to the embodiment of this invention of FIG. 2, which is produced in the chromatic aberration correction, is described later with reference to FIG. 4, FIG. 5, FIG. 6A, and FIG. 6B.

Also in the aberration corrector 6 of FIG. 2, by appropriately superimposing a dipole field, a hexapole field, or an octupole field on the multipoles in the respective stages, it is possible to correct the aperture aberration up to the third order including the parasitic aberration in the same manner as in the related art. In this example, the second and third multipoles are each separated into the electrostatic multipole and the magnetic multipole, but only the magnetic multipoles 20, 21b, 24b, and 25 suffice as the multipoles on which the octupole field or the like is to be superimposed for an aperture aberration correction. The electrostatic multipoles 22b and 23b can also be mechanically formed as quadrupoles so as to solely form quadrupole fields.

Figure 3:
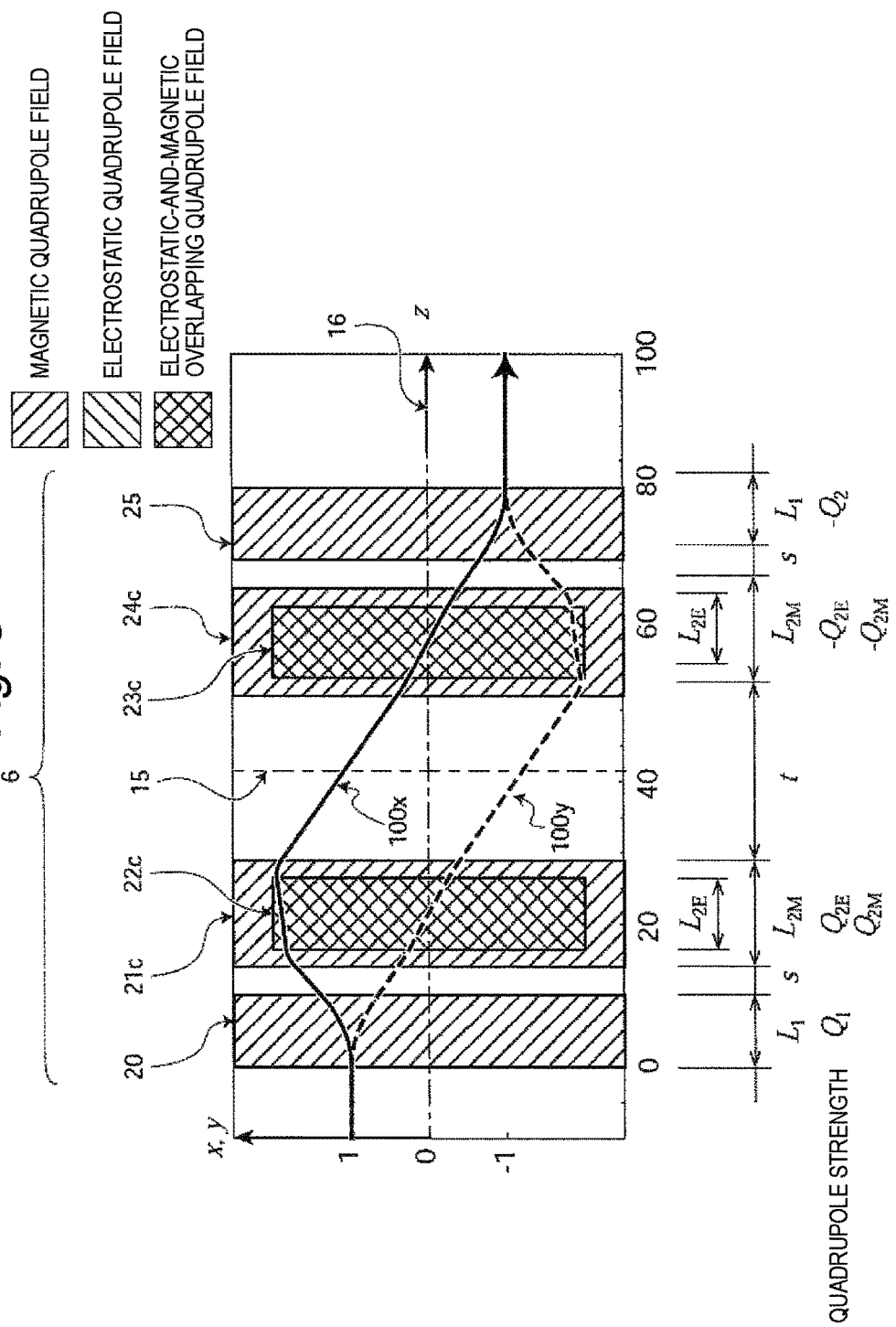
FIG. 3 is a diagram for illustrating another pole configuration of the antisymmetric multi-quadrupole chromatic-and-spherical aberration corrector according to this invention and an electron trajectory for the aberration correction.

FIG. 3 is an illustration of another example of the configuration of the aberration corrector 6 according to the embodiment of this invention. In the example of FIG. 3, the complex electromagnetic multipoles in the second stage and the third stage are separated into magnetic multipoles 21c and 24c and electrostatic multipoles 22c and 23c, and widths to be acted on by both are each changed. As a requirement for maintaining the symmetric property and the antisymmetric property of the pole configuration and the excitation with respect to the corrector center plane 15, the magnetic multipole 21c and the electrostatic multipole 22c of the second group have the same widths as those of the corresponding magnetic multipole 24c and the corresponding electrostatic multipole 23c of the third group.

In the same manner as in the case of the aberration correctors having the configurations of FIG. 8 and FIG. 2, the electrons passing through the aberration corrector 6 are caused to branch off at the first quadrupole 20 into the x-direction and the y-direction, and follow the respective trajectories 100x and 100y to pass through the inside of the corrector. The symmetric property of the trajectories of the x-trajectory 100x and the y-trajectory 100y is the same as those of FIG. 8 and FIG. 2, and hence the negative chromatic aberrations in the x-direction and the y-direction are generated in the second group multipoles 21c and 22c and the third group multipoles 23c and 24c, respectively. When exiting the aberration corrector 6, the electron beam is imparted the negative chromatic aberration exhibiting equal values in both the x-direction and the y-direction, that is, being rotationally symmetric, based on the above-mentioned symmetric properties of the multipoles and the trajectories. The negative chromatic aberration and the positive chromatic aberration of the objective lens 11 cancel each other out, to thereby achieve the chromatic aberration correction.

Also in the aberration corrector 6 of FIG. 3, by appropriately superimposing a dipole field, a hexapole field, or an octupole field on the multipoles in the respective stages in the same manner as described with the configuration of FIG. 2, it is possible to correct the aperture aberration up to the third order including the parasitic aberration. Only the magnetic multipoles 20, 21c, 24c, and 25 suffice as the multipoles on which the octupole field or the like is to be superimposed for the aperture aberration correction, and in the same manner as in the example of FIG. 2, the electrostatic multipoles can also be mechanically formed as quadrupoles so as to solely form quadrupole fields.

With reference to FIG. 4 and FIG. 5, a description is made of an effect produced by the aberration corrector configuration according to the embodiment of this invention. Results shown in FIG. 4 and FIG. 5 are calculated based on the configuration example of the aberration corrector illustrated in FIG. 2 through use of parameters in Table 1 shown below. A rectangular field approximation is assumed for a distribution of a quadrupole field.

TABLE 1

| Parameter | Details | Set value |
|---|---|---|
| $L_1$ | Pole width of first quadrupole 20 and fourth quadrupole 25 | 10 mm |
| s | Interval between first quadrupole 20 and second group magnetic quadrupole 21b Interval between third group magnetic quadrupole 24b and fourth quadrupole 25 | 0 mm |
| $L_{2M}$ | Pole width of second group magnetic quadrupole 21b and third group magnetic quadrupole 24b | 10 mm |
| $L_{2E}$ | Pole width of second group electrostatic quadrupole 22b and third group electrostatic quadrupole 23b | 10 mm |
| t | Interval between second group electrostatic quadrupole 22b and third group electrostatic quadrupole 23b | 15 mm |
| $\Phi_0$ | Electron energy | 1,000 eV |

In FIG. 4, a change in a chromatic aberration coefficient $C_C$, which is exhibited when the strength $\theta_{2E}$ of the two electrostatic quadrupoles 22b and 23b inside the aberration corrector 6 is changed while a symmetry condition is maintained between the x-trajectory 100x and the y-trajectory 100y under the conditions of Table 1, is plotted for comparison between the related-art configuration of FIG. 8 and the configuration according to the embodiment of this invention of FIG. 2. The symmetry condition between the x-trajectory 100x and the y-trajectory 100y is visually illustrated in FIG. 8 and FIG. 2, and is expressed below by Expression (6) when being described as expressions:

$$x(z_m) = -y(z_m)$$

$$x'(z_m) = y'(z_m) \quad \text{Expression (6)}$$

where $z_m$ represents a z-coordinate of the corrector center plane 15 of the aberration corrector 6, and differentiation of the second expression is conducted with respect to z. Here in the case of the configuration according to the embodiment of this invention, overlapping widths w between the magnetic quadrupoles 21b and 24b and the electrostatic quadrupoles 22b and 23b of the second group and the third group, respectively, are each set to 5 (millimeters). The vertical axis indicates a chromatic aberration coefficient $C_C/f^2$ standardized by a focal length f of an imaging lens.

As shown in the graph of FIG. 4, a chromatic aberration coefficient 502 of the related-art configuration of the aberration corrector illustrated in FIG. 8 and a chromatic aberration coefficient 501 of the aberration corrector having the configuration according to the embodiment of this invention illustrated in FIG. 2 both have positive values when $\theta_{2E}=0$, but the values decrease as $\theta_{2E}$ increases, and finally take negative values. However, in particular, the chromatic aberration coefficient 501 of the configuration according to the embodiment of this invention decreases more gradually than the chromatic aberration coefficient 502 of the related-art configuration. This leads to an observation that a chromatic aberration corrector having the configuration according to the embodiment of this invention of FIG. 2 is less sensitive to fluctuations of the electrostatic quadrupole strength $\theta_{2E}$, and that the aberration corrector having the configuration according to the embodiment of this invention illustrated in FIG. 2 is stabler against fluctuations of the power source configured to excite the electrostatic quadrupole. In other words, as an effect of this invention, the stability required for the power source configured to drive the multipole can be alleviated.

The above-mentioned difference can be explained qualitatively as follows. In the related-art configuration of FIG. 8, which uses the complex electromagnetic quadrupoles 21-22 and 23-24 in the second stage and the third stage to cause the distributions of an electrostatic quadrupole field and a magnetic quadrupole field to coincide with each other, $C_C$ decreases monotonously as $\theta_{2E}$ increases unless there are no physical limits including a power source capacity, a dielectric strength, and magnetic saturation of a pole. It is therefore possible to theoretically obtain an arbitrarily large negative chromatic aberration. Meanwhile, in the configuration according to the embodiment of this invention of FIG. 2, which is obtained by separating the complex electromagnetic quadrupole into the electrostatic quadrupoles 22b and 23b and the magnetic quadrupoles 21b and 24b and displacing action positions of both on purpose, a negative chromatic aberration is generated within a range of w in which the electrostatic quadrupoles 22b and 23b and the magnetic quadrupoles 21b and 24b overlap with each other based on the same principle as that of the related art, while the generation of a negative chromatic aberration is rather suppressed in an outside region in which only an outer electrostatic quadrupole field or the magnetic quadrupole field exists. As a result, in the configuration according to the embodiment of this invention of FIG. 2, even when $\theta_{2E}$ is increased, the chromatic aberration coefficient $C_C$ does not decrease to a value equal to or lower than a given lowest value depending on the overlapping width w between the electrostatic quadrupole and the magnetic quadrupole. For example, under the calculation conditions of Table 1, in a case where w<2.4 (millimeters), $C_C$ is inhibited from taking a negative value even when $\theta_{2E}$ is increased. As a result, in the aberration corrector having the configuration according to the embodiment of this invention of FIG. 2, $C_C$ decreases more gradually than $\theta_{2E}$ increases, and the effect described in the previous passage can be obtained.

In a charged particle optical system configured to conduct the chromatic aberration correction with a normal SEM or the like, the positive chromatic aberration to be corrected due to the objective lens or the like takes a fixed value or a value within a limited range. Therefore, it suffices that the chromatic aberration corrector can generate a negative aberration sufficient to cancel the positive chromatic aberration. In the aberration corrector having the configuration according to the embodiment of this invention of FIG. 2, a maximum value of the negative chromatic aberration obtained by adjusting the overlapping width w between the electrostatic quadrupole and the magnetic quadrupole of the second group and the third group can be adjusted in accordance with an amount of the positive chromatic aberration to be corrected. In addition, the change of the aberration coefficient $C_C$ relative to the fluctuations of $\theta_{2E}$ becomes smaller in the vicinity of those conditions, with the result that it is possible to achieve the chromatic aberration correction that is more stable than that of the related art.

FIG. 5 is a graph for showing a power source stability obtained when the aberration corrector having the configuration according to the embodiment of this invention illustrated in FIG. 2 is operated under the conditions of Table 1 in the same manner as in FIG. 4. In other words, in the vertical axis, the power source stability required for exciting the respective multipoles is plotted relative to the overlapping width w between the electrostatic quadrupole and the magnetic quadrupole. The left end of the graph of FIG. 5 corresponds to w=5 (millimeters) set in the aberration corrector having the configuration according to the embodiment of this invention of FIG. 2 shown in the graph of FIG. 4, and the right end of the graph indicates such a condition of $w=L_{2E}=L_{2M}=10$ (millimeters) as to cause the electrostatic quadrupole and the magnetic quadrupole to overlap with each other across the entire width, which is therefore equivalent to the aberration corrector having the related-art configuration of FIG. 8.

The vertical axis indicates the required power source stability by a logarithmic axis. In the graph, the stabilities of the power source regarding the first quadrupole 20 and the magnetic quadrupole 21b and the electrostatic quadrupole 22b of the second group are displayed relative to w. The same power source stabilities as those of the quadrupoles respectively arranged in the symmetric positions are also required for the magnetic quadrupole 24b and the electrostatic quadrupole 23b of the third group and the fourth quadrupole 25 based on antisymmetric excitation conditions for the quadrupoles arranged symmetrically with respect to the corrector center plane 15 of the aberration corrector 6 being used as a symmetry plane.

The following common points between the related-art configuration of FIG. 8 and the aberration corrector having the configuration according to the embodiment of this invention of FIG. 2 are recognized from FIG. 5. First, a stricter power source stability is required for the power source for exciting the second (or third) quadrupole or each of the quadrupoles of the second group (or third group) than in the case of the first (fourth) quadrupole. Moreover, as described above, the strictest required power source stability for the magnetic quadrupole of the second group is found to be on the order of $10^{-7}$ (−7th power of 10).

The results of the calculation using a model based on the configuration according to the embodiment of this invention of FIG. 2 are shown above. Although not shown, it was confirmed through calculation that the effects of the stabilization of the chromatic aberration correction described with reference to FIG. 4 and the alleviation of the required power source stability described with reference to FIG. 5 are similarly obtained through use of the different configuration illustrated in FIG. 3 in which the width is caused to differ between the electrostatic quadrupole and the magnetic quadrupole.

Meanwhile, when a focus is placed on the change of the required power source stability relative to the overlapping width w between the electrostatic quadrupole and the magnetic quadrupole, it is recognized that the required power source stability for the aberration corrector with an overlap across the entire width, that is, the aberration corrector having the related-art configuration of FIG. 8, becomes lower as w decreases. In particular, in regard to the magnetic quadrupole 21b of the second group required to exhibit the strictest power source stability among the poles, a power source stability of equal to or smaller than 0.45 ppm is required for the related-art configuration (w=10 (millimeters)), while the requirement is alleviated down to nearly two times (equal to or smaller than 0.80 ppm) the related-art value when the overlapping width is decreased to w=5 (millimeters). The reason for this corresponds to the cause of the stabilization of the chromatic aberration correction, which has been described qualitatively with reference to FIG. 4.

FIG. 6A and FIG. 6B are illustrations of an example of structure for mechanically manufacturing the aberration corrector 6 having the configuration according to the embodiment of this invention of FIG. 2. FIG. 6A and FIG. 6B are a sectional view taken along a vertical plane and a sectional view taken along a horizontal plane, respectively. In the aberration corrector having the configuration according to the embodiment of this invention of FIG. 2, the electromagnetic complexes 21-22 and 23-24 of the related-art configuration of FIG. 8 can be separated into the different electrostatic quadrupoles 22b and 23b and the different magnetic quadrupoles 21b and 24b, respectively, and can be arranged separately from each other. In particular, FIG. 6A and FIG. 6B are illustrations for showing an example of sealing by a vacuum a central part of a liner tube 250, through which electrons are to pass, and arranging only the electrostatic quadrupoles 240a and 243a inside the vacuum. Such a portion of an optical system is not limited to the liner tube 250 as long as it is possible to employ a configuration in which a passage of electrons is maintained to be a vacuum and poles are located outside the vacuum. In this case, such a portion is referred to collectively as "vacuum path unit for electrons". The vacuum referred to in this case includes, in its definition, not only an ideal vacuum state but also a state of being decompressed to such a given level as to allow a charged particle beam to pass in actuality.

When the liner tube 250 is formed of a non-magnetic material, all the magnetic quadrupoles can be located outside the liner tube 250 or outside the vacuum. FIG. 6A and FIG. 6B are illustrations for showing an example utilizing such an advantage, in which the first quadrupole and the fourth quadrupole also employ magnetic quadrupoles, and such magnetic poles 200a and 230a and the like are arranged outside the liner tube 250 along with magnetic quadrupoles 210a and 220a of the second group and the third group. Such structure eliminates the need to take a measure to use an O-ring or the like for vacuum sealing between the respective magnetic poles including 200a and a support member 260, and produces an effect of enabling vacuum sealing spots to be greatly reduced.

Specifically, the vacuum sealing may be achieved by O-rings 251 and 253 and the like at upper and lower ends of the liner tube 250 and spots for introducing voltage lines for exciting the electrostatic quadrupoles. In FIG. 6A and FIG. 6B, the voltage lines are shown to be individually introduced through the positions of the respective poles in order to clarify correspondences between the electrostatic quadrupoles 240a and 243a and the like and voltage lines 241a and 244a and the like, but may be collectively introduced through one spot in an actual case. Therefore, according to the example of the structure illustrated in FIG. 6A and FIG. 6B, compared with the related-art configuration, the vacuum sealing spots inside the aberration corrector can be reduced to at least three spots while being seventy spots or more in FIG. 9A and FIG. 9B. With this configuration, a magnetic twelve-pole can employ structure having higher rigidity, with the result that the mechanical assembly accuracy for the above-mentioned portion can be enhanced.

In addition, as described in relation to the principle of the aberration correction using the configuration according to the embodiment of this invention of FIG. 2, a four-stage magnetic multipole can be made responsible for all roles of correcting the aperture aberration up to the third order when the structure of the aberration corrector of FIG. 6A and FIG. 6B is employed.

Figure 7B:
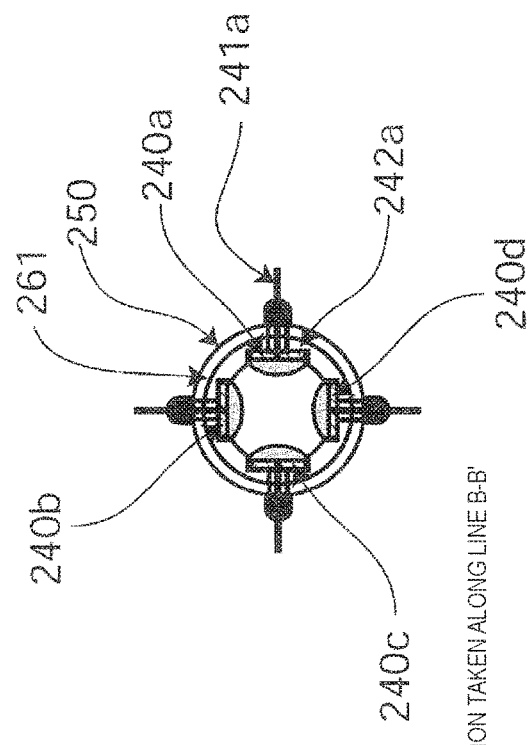
FIG. 7B is a diagram for illustrating the configuration example (horizontal section) of the electrostatic quadrupole part within the mechanical structure exemplified in FIG. 6B according to the embodiment of this invention.

FIG. 6A and FIG. 6B are illustrations for showing, on the above-mentioned assumption, an example in which those magnetic multipoles are formed of a twelve-pole 210a to 210l and the like. In this case, it suffices that the electrostatic multipole located inside the vacuum can simply generate only the quadrupole field required for the chromatic aberration correction, and hence the mechanical configuration itself can be made to become a quadrupole. An example of structure of the electrostatic quadrupole portion for this case is shown in FIG. 7A and FIG. 7B. FIG. 7A and FIG. 7B are a sectional view taken along a vertical plane and a sectional view taken along a horizontal plane, respectively. The two quadrupoles 240a or the like and 243a or the like are provided to one quadrupole support member 261 across insulating thin plates 242a and 245a or the like, respectively, in order to enhance arrangement accuracy between electrodes inside each quadrupole and between the respective quadrupoles.

The quadrupole support member 260 can be formed of a non-magnetic metal, and any insulating thin plate made of an insulating material having a dielectric performance of about 100 V may be used, but in order to enhance the machine accuracy, it is conceivable to use a ceramic thin plate having high hardness or the like. The two quadrupoles are formed of four poles 240a to 240d and four poles 243a to 243d (poles 243b to 243d are not shown) as simple quadrupoles as described above. By introducing an electrostatic quadrupole portion integrated in the above-mentioned manner into the vacuum of the liner tube 250, it is possible to arrange two electrostatic quadrupoles with high machine accuracy. When parasitic aberrations are further generated due to insufficient machine accuracy or the like of the electrostatic quadrupole portion, those parasitic aberrations up to the third order can be compensated through use of the magnetic twelve-poles 200a, 210a, 220a, and 230a in four stages and the like that are arranged outside the vacuum.

Such structure (vacuum path unit) illustrated in FIG. 6A and FIG. 6B in which the magnetic twelve-poles are arranged outside the vacuum can also be provided with a mechanism that enables the entirety of each twelve-pole to be mechanically adjusted in position within the horizontal plane. Use of such fine positional adjustment of the magnetic twelve-pole allows readjustment of the center of the electrostatic quadrupole field and the center of the magnetic quadrupole field formed by the magnetic twelve-pole, which can further contribute to the stabilization of the chromatic aberration correction. An actuator using a piezoelectric element can be used as a mechanism for driving the fine positional adjustment on the order of equal to or smaller than one micrometer, which is required for the above-mentioned stabilization. In addition, the same effects can be expected even when a related-art mechanical set-screw mechanism used for positional adjustment of an electromagnetic lens is used for the above-mentioned positional adjustment.

As described above, an antisymmetric multi-quadrupole chromatic-and-spherical aberration corrector having the configuration in which at least two complex electromagnetic quadrupoles used for a related-art antisymmetric fourfold quadrupole chromatic-and-spherical aberration corrector are separated into the magnetic quadrupoles and the electrostatic quadrupoles with their positions being displaced or with the width therebetween being caused to differ. With this configuration, it is possible to generate the negative chromatic aberration sufficient to cancel out the positive chromatic aberration generated by the objective lens or the like, and to achieve the chromatic aberration correction with the required power source stability that is lower than in the related art.

It is further possible to greatly simplify the structure of the aberration corrector due to, for example, the reduction of the vacuum sealing spots, by separating the complex electromagnetic multipoles into the electrostatic multipoles and the magnetic multipoles as described above. With this configuration, improvement can be expected in the rigidity and mechanical accuracy of the respective electrostatic multipoles and the respective magnetic multipoles. In particular, it is possible to provide the structure in which only the electrostatic multipoles are arranged inside the vacuum and the magnetic multipoles can be arranged outside the vacuum as exemplified in FIG. 6A and FIG. 6B. In particular, such a configuration as to compensate all the aperture aberrations up to the third order by the magnetic multipoles outside the vacuum can also be achieved when the magnetic multipoles outside the vacuum are formed of twelve-poles and simple quadrupoles are used as the electrostatic multipoles located inside the vacuum. The embodiment of this invention has been described mainly through the use of the quadrupoles and the twelve-poles in the above-mentioned manner. However, it should be noted that the numbers of poles of the multipoles are not limited to that of the embodiment within the scope that does not depart from the gist of this invention.

REFERENCE SIGNS LIST

1: SEM lens barrel, 2: SEM sample chamber, 3: electron gun, 4: converging lens, 5: deflector, 6: multistage multipole aberration corrector, 7: intermediate lens (second converging lens), 8: deflector, 9: secondary electron detector, 10: scanning coil, 11: objective lens, 12: sample, 13: sample stage, 14: center axis, 15: corrector center plane, 20: magnetic quadrupole 1, 20b: magnetic quadrupole 1, configuration 1, 20c: magnetic quadrupole 1, configuration 2, 21: magnetic quadrupole 2, 21b: magnetic quadrupole 2, 21c: magnetic quadrupole 2, 22: electrostatic quadrupole 1, 23: electrostatic quadrupole 2, 24: magnetic quadrupole 3, 25: magnetic quadrupole 4, 50: control console, 51: aberration correction control power source, 52: electron microscope controller, 100x: electron beam trajectory, x-z plane, 100y: electron beam trajectory, y-z plane, 200a to 200l: first-stage magnetic pole, 201a to 201l: first-stage exciting coil, 202a to 202l: vacuum sealing O-ring, 210a to 210l: second-stage magnetic pole, 211a to 211l: second-stage exciting coil, 212a to 212l: vacuum sealing O-ring, 213a to 213l: vacuum sealing O-ring, 214a to 214l: insulating sleeve, 215a to 215l: voltage application line, 220a to 220l: third-stage magnetic pole, 221a to 221l: third-stage exciting coil, 222a to 222l: vacuum sealing O-ring, 223a to 223l: vacuum sealing O-ring, 224a to 224l: insulating sleeve, 225a to 225l: voltage application line, 230a to 230l: fourth-stage magnetic pole, 231a to 231l: fourth-stage exciting coil, 232a to 232l: vacuum sealing O-ring, 240a to 240d: first electrostatic pole, 241a to 241d: voltage application line, 242a to 242d: insulating plate, 243a to 243d: second electrostatic pole, 244a to 244d: voltage application line, 245a to 245d: insulating plate, 250: liner tube (vacuum path unit), 251: vacuum sealing O-ring, 252: O-ring presser, 253: vacuum sealing O-ring, 254: O-ring presser, 260: multipole support member, 261: electrostatic pole support member, 500: graph for showing electrostatic quadrupole strength and chromatic aberration coefficient

What is claimed is:

1. A charged particle beam apparatus, which is configured to irradiate a sample with a charged particle beam to detect a charged particle ascribable to the sample, the charged particle beam apparatus comprising an aberration correction unit, the aberration correction unit comprising:
a first magnetic quadrupole and a second magnetic quadrupole;
a third magnetic quadrupole and a fourth magnetic quadrupole that are provided between the first magnetic quadrupole and the second magnetic quadrupole; and
a first electrostatic quadrupole and a second electrostatic quadrupole that are provided between the first magnetic quadrupole and the second magnetic quadrupole, wherein
the first magnetic quadrupole, the second magnetic quadrupole, the third magnetic quadrupole and the fourth magnetic quadrupole and the first electrostatic quadrupole and a second electrostatic quadrupole are arranged symmetrically with respect to a center symmetry plane, and are respectively excited antisymmetrically;
the second magnetic quadrupole is provided in a first plane that is different from a second plane in which the first electrostatic quadrupole is provided;
the third magnetic quadrupole is provided in a third plane that is different from a fourth plane in which the second electrostatic quadrupole is provided;
the aberration correction unit is arranged on one of a path for irradiating the sample with the charged particle beam and a path for detecting the charged particle ascribable to the sample;

the charged particle beam apparatus further comprises a vacuum path unit configured to decompress a path of the charged particle beam passing through the aberration correction unit;

the first electrostatic quadrupole and the second electrostatic quadrupole are arranged within a decompressed space inside the vacuum path unit, wherein a support is arranged between the first and second electrostatic quadrupoles, along an interior of a liner tube disposed within the decompressed space, and is constructed to provide alignment accuracy of said first and second electrostatic quadrupoles;

the first magnetic quadrupole, the second magnetic quadrupole, the third magnetic quadrupole and the fourth magnetic quadrupole each comprising the excitation unit are arranged outside the vacuum path unit; and the aberration correction unit is configured to adjust an amount of chromatic aberration correction by adjusting an amount of overlap between one of said magnetic quadrupoles and a corresponding one of said electrostatic quadrupoles.

2. A charged particle beam apparatus, which is configured to irradiate a sample with a charged particle beam to detect a charged particle ascribable to the sample, the charged particle beam apparatus comprising an aberration correction unit, the aberration correction unit comprising:
- a first magnetic quadrupole and a second magnetic quadrupole;
- a third magnetic quadrupole and a fourth magnetic quadrupole that are provided between the first magnetic quadrupole and the second magnetic quadrupole; and
- a first electrostatic quadrupole and a second electrostatic quadrupole that are provided between the first magnetic quadrupole and the second magnetic quadrupole, wherein the first magnetic quadrupole, the second magnetic quadrupole, the third magnetic quadrupole and the fourth magnetic quadrupole and the first electrostatic quadrupole and a second electrostatic quadrupole are arranged symmetrically with respect to a center symmetry plane, and are respectively excited antisymmetrically;

the second magnetic quadrupole exerts an action on a magnetic field having a width that is different from a width of an electric field on which the first electrostatic quadrupole exerts an action;

the third magnetic quadrupole exerts an action on a magnetic field having a width that is different from a width of an electric field on which the second electrostatic quadrupole exerts an action;

the aberration correction unit is arranged on one of a path for irradiating the sample with the charged particle beam and a path for detecting the charged particle ascribable to the sample;

the charged particle beam apparatus further comprises a vacuum path unit configured to decompress a path of the charged particle beam passing through the aberration correction unit;

the first electrostatic quadrupole and the second electrostatic quadrupole are arranged within a decompressed space inside the vacuum path unit, wherein a support is arranged between the first and second electrostatic quadrupoles, along an interior of a liner tube disposed within the decompressed space, and is constructed to provide alignment accuracy of said first and second electrostatic quadrupoles;

the first magnetic quadrupole, the second magnetic quadrupole, the third magnetic quadrupole and the fourth magnetic quadrupole each comprising the excitation unit are arranged outside the vacuum path unit; and the aberration correction unit is configured to adjust an amount of chromatic aberration correction by adjusting an amount of overlap between one of said magnetic quadrupoles and a corresponding one of said electrostatic quadrupoles.

3. A charged particle beam apparatus, which is configured to irradiate a sample with a charged particle beam to detect a charged particle ascribable to the sample, the charged particle beam apparatus comprising an aberration correction unit comprising at least four stages of quadrupoles each provided in a plane, the aberration correction unit comprising:
- a first magnetic quadrupole provided in a first plane;
- a second magnetic quadrupole provided in a second plane below the first plane;
- a third magnetic quadrupole provided in a third plane below the second plane;
- a fourth magnetic quadrupole provided in a fourth plane below the third plane; and
- a first electrostatic quadrupole and a second electrostatic quadrupole, which are provided between the first magnetic quadrupole and the second magnetic quadrupole, and are excited antisymmetrically with respect to a center symmetry plane of the aberration correction unit, wherein the aberration correction unit is configured to form:
- a first field in which a first electric field generated by the first electrostatic quadrupole and a first magnetic field generated by the second magnetic quadrupole are superimposed on each other;
- a second field in which one of the first electric field and the first magnetic field solely exerts an action;
- a third field in which a second electric field generated by the second electrostatic quadrupole and a second magnetic field generated by the third magnetic quadrupole are superimposed on each other; and
- a fourth field in which one of the second electric field and the second magnetic field solely exerts an action; and the aberration correction unit is arranged on one of a path for irradiating the sample with the charged particle beam and a path for detecting the charged particle ascribable to the sample;

the charged particle beam apparatus further comprises a vacuum path unit configured to decompress a path of the charged particle beam passing through the aberration correction unit;

the first electrostatic quadrupole and the second electrostatic quadrupole are arranged within a decompressed space inside the vacuum path unit, wherein a support is arranged between the first and second electrostatic quadrupoles, along an interior of a liner tube disposed within the decompressed space, and is constructed to provide alignment accuracy of said first and second electrostatic quadrupoles;

the first magnetic quadrupole, the second magnetic quadrupole, the third magnetic quadrupole and the fourth magnetic quadrupole each comprising the excitation unit are arranged outside the vacuum path unit; and the aberration correction unit is configured to adjust an amount of chromatic aberration correction by adjusting an amount of overlap between one of said magnetic quadrupoles and a corresponding one of said electrostatic quadrupoles.

4. The charged particle beam apparatus according to claim 1, wherein:
the first magnetic quadrupole, the second magnetic quadrupole, the third magnetic quadrupole, and the fourth magnetic quadrupole each comprise an excitation unit configured to generate a magnetic field.

5. The charged particle beam apparatus according to claim 2, wherein:
the first magnetic quadrupole, the second magnetic quadrupole, the third magnetic quadrupole, and the fourth magnetic quadrupole each comprise an excitation unit configured to generate a magnetic field.

6. The charged particle beam apparatus according to claim 3, wherein:
the first magnetic quadrupole, the second magnetic quadrupole, the third magnetic quadrupole, and the fourth magnetic quadrupole each comprise an excitation unit configured to generate a magnetic field.

7. The charged particle beam apparatus according to claim 1, further comprising a position adjusting unit configured to adjust relative positions of at least any one of the first magnetic quadrupole, the second magnetic quadrupole, the third magnetic quadrupole, and the fourth magnetic quadrupole and one of the first electrostatic quadrupole and the second electrostatic quadrupole along an optical axis of the charged particle beam passing through the aberration correction unit.

8. The charged particle beam apparatus according to claim 2, further comprising a position adjusting unit configured to adjust relative positions of at least any one of the first magnetic quadrupole, the second magnetic quadrupole, the third magnetic quadrupole, and the fourth magnetic quadrupole and one of the first electrostatic quadrupole and the second electrostatic quadrupole along an optical axis of the charged particle beam passing through the aberration correction unit.

9. The charged particle beam apparatus according to claim 3, further comprising a position adjusting unit configured to adjust relative positions of at least any one of the first magnetic quadrupole, the second magnetic quadrupole, the third magnetic quadrupole, and the fourth magnetic quadrupole and one of the first electrostatic quadrupole and the second electrostatic quadrupole along an optical axis of the charged particle beam passing through the aberration correction unit.

10. The charged particle beam apparatus according to claim 1, wherein:
the first magnetic quadrupole, the second magnetic quadrupole, the third magnetic quadrupole, and the fourth magnetic quadrupole each comprise at least twelve poles; and
the first magnetic quadrupole, the second magnetic quadrupole, the third magnetic quadrupole, and the fourth magnetic quadrupole are each configured to generate a quadrupole field, and to generate any one of a deflection field, a hexapole field, an octupole field, a twelve-pole field, and another quadrupole field exhibiting a phase different from that of the quadrupole field.

11. The charged particle beam apparatus according to claim 2, wherein:
the first magnetic quadrupole, the second magnetic quadrupole, the third magnetic quadrupole, and the fourth magnetic quadrupole each comprise at least twelve poles; and
the first magnetic quadrupole, the second magnetic quadrupole, the third magnetic quadrupole, and the fourth magnetic quadrupole are each configured to generate a quadrupole field, and to generate any one of a deflection field, a hexapole field, an octupole field, a twelve-pole field, and another quadrupole field exhibiting a phase different from that of the quadrupole field.

12. The charged particle beam apparatus according to claim 3, wherein:
the first magnetic quadrupole, the second magnetic quadrupole, the third magnetic quadrupole, and the fourth magnetic quadrupole each comprise at least twelve poles; and
the first magnetic quadrupole, the second magnetic quadrupole, the third magnetic quadrupole, and the fourth magnetic quadrupole are each configured to generate a quadrupole field, and to generate any one of a deflection field, a hexapole field, an octupole field, a twelve-pole field, and another quadrupole field exhibiting a phase different from that of the quadrupole field.

13. An aberration corrector, comprising:
a first magnetic quadrupole and a second magnetic quadrupole;
a third magnetic quadrupole and a fourth magnetic quadrupole that are provided between the first magnetic quadrupole and the second magnetic quadrupole; and
a first electrostatic quadrupole and a second electrostatic quadrupole that are provided between the first magnetic quadrupole and the second magnetic quadrupole, wherein
the first magnetic quadrupole, the second magnetic quadrupole, the third magnetic quadrupole and the fourth magnetic quadrupole and the first electrostatic quadrupole and a second electrostatic quadrupole are arranged symmetrically with respect to a center symmetry plane, and are respectively excited antisymmetrically;
the second magnetic quadrupole is provided in a first plane that is different from a second plane in which the first electrostatic quadrupole is provided;
the third magnetic quadrupole is provided in a third plane that is different from a fourth plane in which the second electrostatic quadrupole is provided;
the first electrostatic quadrupole and the second electrostatic quadrupole are arranged within a decompressed space, wherein a support is arranged between the first and second electrostatic quadrupoles, along an interior of a liner tube disposed within the decompressed space, and is constructed to provide alignment accuracy of said first and second electrostatic quadrupoles; and
the first magnetic quadrupole, the second magnetic quadrupole, the third magnetic quadrupole and the fourth magnetic quadrupole each comprising the excitation unit are arranged outside the decompressed space,
wherein, an amount of overlap between one of said magnetic quadrupoles and a corresponding one of said electrostatic quadrupoles is adjustable so as to adjust a chromatic aberration correction amount.

14. An aberration corrector, comprising:
a first magnetic quadrupole and a second magnetic quadrupole;
a third magnetic quadrupole and a fourth magnetic quadrupole that are provided between the first magnetic quadrupole and the second magnetic quadrupole; and a first electrostatic quadrupole and a second electrostatic quadrupole that are provided between the first magnetic quadrupole and the second magnetic quadrupole, wherein the first magnetic quadrupole, the second magnetic quadrupole, the third magnetic quadrupole and the fourth magnetic quadrupole and the first electrostatic quadrupole and a second electrostatic quadrupole are arranged symmetrically with respect to a center symmetry plane, and are respectively excited antisymmetrically;

the second magnetic quadrupole exerts an action on a magnetic field having a width that is different from a width of an electric field on which the first electrostatic quadrupole exerts an action;

the third magnetic quadrupole exerts an action on a magnetic field having a width that is different from a width of an electric field on which the second electrostatic quadrupole exerts an action;

the first electrostatic quadrupole and the second electrostatic quadrupole are arranged within a decompressed space inside the vacuum path unit, wherein a support is arranged between the first and second electrostatic quadrupoles, along an interior of a liner tube disposed within the decompressed space, and is constructed to provide alignment accuracy of said first and second electrostatic quadrupoles; and the first magnetic quadrupole, the second magnetic quadrupole, the third magnetic quadrupole and the fourth magnetic quadrupole each comprising the excitation unit are arranged outside the decompressed space, wherein, an amount of overlap between one of said magnetic quadrupoles and a corresponding one of said electrostatic quadrupoles is adjustable so as to adjust a chromatic aberration correction amount.

* * * * *